United States Patent
Ito et al.

(10) Patent No.: US 11,150,028 B2
(45) Date of Patent: *Oct. 19, 2021

(54) COOLING DEVICE WITH SUPERIMPOSED FIN GROUPS AND PARALLEL HEATPIPES

(71) Applicant: FURUKAWA ELECTRIC CO., LTD., Tokyo (JP)

(72) Inventors: Shinichi Ito, Tokyo (JP); Masahiro Meguro, Tokyo (JP); Kenya Kawabata, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/797,501

(22) Filed: Feb. 21, 2020

(65) Prior Publication Data

US 2020/0191494 A1 Jun. 18, 2020

Related U.S. Application Data

(63) Continuation of application No. 15/866,688, filed on Jan. 10, 2018, now Pat. No. 10,571,199, which is a
(Continued)

(30) Foreign Application Priority Data

Jul. 14, 2015 (JP) .............................. JP2015-140194

(51) Int. Cl.
*F28D 15/02* (2006.01)
*H05K 7/20* (2006.01)
(Continued)

(52) U.S. Cl.
CPC ......... *F28D 15/02* (2013.01); *H05K 7/20409* (2013.01); *F28D 15/0275* (2013.01);
(Continued)

(58) Field of Classification Search
CPC ........ G06F 1/20; H05K 7/20; H05K 7/20409; H01L 23/367; F28D 15/0275; F28D 15/02
(Continued)

(56) References Cited

U.S. PATENT DOCUMENTS 5,229,915 A * 7/1993 Ishibashi ............... H01L 23/427
165/104.33
5,513,070 A * 4/1996 Xie ......................... G06F 1/203
165/185
(Continued)

FOREIGN PATENT DOCUMENTS

CN 102436295 A 5/2012
JP 2008-130037 A 6/2008
(Continued)

OTHER PUBLICATIONS

International Search Report (ISR) issued in PCT/JP2016/070774 dated Oct. 2016.
(Continued)

*Primary Examiner* — Paul Alvare
(74) *Attorney, Agent, or Firm* — Chen Yoshimura LLP

(57) ABSTRACT

A cooling device includes first heat pipes thermally connected to a first heat-generating element at one end and thermally connected to the superimposed first and second heat-radiating fin groups at another end; and second heat pipes thermally connected to a second heat-generating element at one end and thermally connected to the superimposed second and third heat-radiating fin groups at another end, wherein the respective another ends of the first heat pipes altogether span a substantially entirety of a planar area between the first and second heat-radiating fin groups, and the respective another ends of the second heat pipes alto-
(Continued)

gether span a substantially entirety of a planar area between the second and third heat-radiating fin groups.

20 Claims, 18 Drawing Sheets

Related U.S. Application Data continuation of application No. PCT/JP2016/070774, filed on Jul. 14, 2016.

(51) Int. Cl.
  *H01L 23/367* (2006.01)
  *G06F 1/20* (2006.01)

(52) U.S. Cl.
  CPC .............. *G06F 1/20* (2013.01); *H01L 23/367* (2013.01); *H05K 7/20* (2013.01); *H05K 7/20127* (2013.01)

(58) Field of Classification Search
  USPC .......................................... 165/80.3, 101.14
  See application file for complete search history.

(56) References Cited

U.S. PATENT DOCUMENTS

| | | | |
|---|---|---|---|
| 5,651,414 A * | 7/1997 | Suzuki | F28D 15/0275 165/104.14 |
| 8,422,218 B2 | 4/2013 | Fried et al. | |
| 9,773,718 B2 * | 9/2017 | Douglas | H01L 23/427 |
| 2007/0272395 A1 * | 11/2007 | Hwang | H01L 23/427 165/104.33 |
| 2008/0093056 A1 | 4/2008 | Hwang et al. | |
| 2008/0123298 A1 | 5/2008 | Takeguchi et al. | |
| 2008/0210404 A1 | 9/2008 | Peng | |
| 2008/0289799 A1 * | 11/2008 | Luo | F28D 15/0275 165/80.3 |
| 2009/0103262 A1 * | 4/2009 | Hata | G06F 1/203 361/689 |
| 2009/0168331 A1 | 7/2009 | Fujiwara | |
| 2009/0195988 A1 | 8/2009 | Hongo | |
| 2009/0236076 A1 | 9/2009 | Min et al. | |
| 2010/0065247 A1 * | 3/2010 | Meyer, IV | F28D 15/04 165/80.3 |
| 2010/0073880 A1 | 3/2010 | Liu | |
| 2010/0157522 A1 * | 6/2010 | Refai-Ahmed | G06F 1/20 361/679.54 |
| 2011/0075360 A1 | 3/2011 | Tomioka et al. | |
| 2011/0149516 A1 * | 6/2011 | Yang | H01L 23/427 361/697 |
| 2012/0160456 A1 * | 6/2012 | Aoki | H01L 23/4006 165/104.26 |
| 2012/0192574 A1 * | 8/2012 | Ghoshal | F28D 15/0266 62/3.2 |
| 2012/0279688 A1 | 11/2012 | Wong et al. | |
| 2013/0014920 A1 * | 1/2013 | Chao | H01L 23/427 165/104.26 |
| 2013/0155616 A1 * | 6/2013 | Tong | H05K 7/20909 361/696 |
| 2013/0291368 A1 * | 11/2013 | Davidson | G06F 1/20 29/592.1 |
| 2016/0018139 A1 | 1/2016 | Olsson et al. | |
| 2016/0209121 A1 | 7/2016 | Yeh et al. | |

FOREIGN PATENT DOCUMENTS

| | | |
|---|---|---|
| JP | 2009-181421 A | 8/2009 |
| JP | 2010-153443 A | 7/2010 |
| JP | 2011-119775 A | 6/2011 |
| JP | 2013-138081 A | 7/2013 |
| TW | 201324095 A | 6/2013 |

OTHER PUBLICATIONS

Written Opinion (PCT/ISA/237) issued in PCT/JP2016/070774 dated Oct. 2016.
Japanese Office Action dated May 23, 2016, in a counterpart Japanese patent application No. 2015-140194.
Japanese Office Action dated Oct. 11, 2016, in a counterpart Japanese patent application No. 2015-140194.
Decision to Grant a Patent dated Mar. 6, 2017 in the counterpart Japanese patent application No. 2015-140194.
Taiwanese Office Action dated May 14, 2018, in a counterpart Taiwanese patent application No. 105122342.
Chinese Office Action dated Oct. 8, 2018, in a counterpart Taiwanese patent application No. 201690000988.4.
Taiwanese Office Action dated Nov. 26, 2018, in a counterpart Taiwanese patent application No. 105122342.

* cited by examiner

|  | Working Example | Comparative Example |
|---|---|---|
| Heat-receiving Area (°C/W) | 0.066 | 0.073 |
| Heat-radiating Area (°C/W) | 0.052 | 0.075 |
| Total (°C/W) | 0.118 | 0.148 |

FIG. 18

COOLING DEVICE WITH SUPERIMPOSED FIN GROUPS AND PARALLEL HEATPIPES

BACKGROUND OF THE INVENTION

Technical Field

The present invention relates to a cooling device that cools a heat-generating element.

Background Art

The increase in higher functionality of electronic devices has led to heat-generating elements, such as electronic components, being installed at high densities inside the electronic devices. Moreover, the amount of heat generated by each electronic component etc. varies widely depending on the difference in function of the electronic components etc. Accordingly, in order to reliably and efficiently cool the heat-generating elements, it is required to have uniform cooling of a plurality of heat-generating elements that generate differing amounts of heat, even if the amount of heat generated is large.

To that end, Patent Document 1 proposes an electronic device including a heat sink for cooling a first heat-generating component, a first heat pipe thermally connecting the first heat-generating component to the heat sink, and a second heat pipe having a first end that thermally connects to a second heat-generating component and a second end that is positioned in the vicinity of the heat sink.

Patent Document 1, however, is problematic in that the second heat pipe is separated from the heat sink and does not uniformly cool the first heat-generating component and second heat-generating component.

RELATED ART DOCUMENT

Patent Document
Patent Document 1: Japanese Patent Application Laid-Open Publication No. 2008-130037

SUMMARY OF THE INVENTION

In view of the above-mentioned situation, the present invention aims at providing a cooling device with excellent uniform cooling for a plurality of heat-generating elements that generate differing amounts of heat. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a cooling device, including: a first heat pipe having one end thermally connected to a first heat-generating element and another end thermally connected to a first heat-radiating fin group that has a plurality of first heat-radiating fins and a second heat-radiating fin group that has a plurality of second heat-radiating fins; and a second heat pipe having one end thermally connected to a second heat-generating element that is disposed closer to the second heat-radiating fin group than the first heat-generating element and another end thermally connected to the second heat-radiating fin group and a third heat-radiating fin group that has a plurality of third heat-radiating fins, wherein the first heat-radiating fin group, the second heat-radiating fin group, and the third heat-radiating fin group form a multilayer structure by the second heat-radiating fin group facing the first heat-radiating fin group across the first heat pipe and the second heat-radiating fin group facing the third heat-radiating fin group across the second heat pipe, and wherein the another end of the first heat pipe is positioned above the another end of the second heat pipe.

In the present specification, "above" means the installation side of the first heat-generating element in the direction orthogonal to the installation plane of the first heat-generating element.

In another aspect, the present disclosure provides a cooling device, including: a first heat pipe having one end thermally connected to a first heat-generating element and another end thermally connected to a first heat-radiating fin group that has a plurality of first heat-radiating fins and a second heat-radiating fin group that has a plurality of second heat-radiating fins; and a second heat pipe having one end thermally connected to a second heat-generating element that is disposed closer to the second heat-radiating fin group than the first heat-generating element and another end thermally connected to the second heat-radiating fin group, wherein the first heat-radiating fin group and the second heat-radiating fin group form a multilayer structure by the second heat-radiating fin group facing the first heat-radiating fin group across the first heat pipe, and wherein the another end of the first heat pipe is positioned above the another end of the second heat pipe.

In the above-mentioned aspect, the third heat-radiating fin group may not be provided.

In another aspect, the present disclosure provides a cooling device, including: a first heat pipe having one end thermally connected to a first heat-generating element and another end thermally connected to a second heat-radiating fin group that has a plurality of second heat-radiating fins; and a second heat pipe having one end thermally connected to a second heat-generating element that is disposed closer to the second heat-radiating fin group than the first heat-generating element and another end thermally connected to the second heat-radiating fin group and a third heat-radiating fin group that has a plurality of third heat-radiating fins, wherein the second heat-radiating fin group and the third heat-radiating fin group form a multilayer structure by the second heat-radiating fin group facing the third heat-radiating fin group across the second heat pipe, and wherein the another end of the first heat pipe is positioned above the another end of the second heat pipe.

In the above-mentioned aspect, the first heat-radiating fin group may not be provided.

Here, the first heat pipe may be introduced from a direction angled with respect a direction in which the plurality of first heat-radiating fins are arranged.

Here, the first heat pipe may be introduced from a direction angled with respect a direction in which the plurality of second heat-radiating fins are arranged.

Here, the second heat pipe may be introduced from a direction angled with respect a direction in which the plurality of third heat-radiating fins are arranged.

Here, the second heat pipe may be introduced from a direction angled with respect a direction in which the plurality of second heat-radiating fins are arranged.

In at least one of the above-mentioned aspects, the first heat pipe may be provided in a plurality in parallel to one another.

In at least one of the above-mentioned aspects, the second heat pipe may be provided in a plurality in parallel to one another.

In at least one of the above-mentioned aspects, at least one of the first heat pipes of the first heat pipe group may be arranged in a positional relationship that overlaps at least one of the second heat pipes of the second heat pipe group in a plan view.

In at least one of the above-mentioned aspects, none of the first heat pipes forming the first heat pipe group may overlaps any of the second heat pipes forming the second heat pipe group in a plan view. In the present specification, "a plan view" means an aspect viewed from a direction above a direction parallel to the layering direction of the heat-radiating fin group.

In at least one of the above-mentioned aspects, a section of the first heat pipe thermally connected to the second heat-radiating fin group may have a bend formed therein.

In at least one of the above-mentioned aspects, a section of the second heat pipe thermally connected to the second heat-radiating fin group may have a bend formed therein.

In at least one of the above-mentioned aspects, portions of the first heat pipe group thermally connected to the second heat-radiating fin group may be arranged with left-right symmetry.

In at least one of the above-mentioned aspects, portions of the second heat pipe group thermally connected to the second heat-radiating fin group may be arranged with left-right symmetry.

In at least one of the above-mentioned aspects, a portion of the first heat pipe thermally connected to the second heat-radiating fin group and/or a portion of the second heat pipe thermally connected to the second heat-radiating fin group may be flattened.

In at least one of the above-mentioned aspects, the cooling device may be used in cooling a calculation element.

According to at least some of the aspects of the present invention, the first heat pipes thermally connected to the first heat-generating element and the second heat pipes thermally connected to the second heat-generating element are all thermally connected to the second heat-radiating fin group; thus, even if the amount of heat generated by the first heat-generating element differs from the amount of heat generated by the second heat-generating element, the second heat-radiating fin group can make the cooling of the first heat-generating element and the second heat-generating element uniform. Even if the difference between the amount of heat generated by the first heat-generating element and the amount of heat generated by the second heat-generating element causes the thermal load of the first heat-radiating fin group to differ from the thermal load of the third heat-radiating fin group, the second heat-radiating fin group receives heat from the heat pipes thermally connected to whichever of the first heat-radiating fin group or third-heat radiating fin group that has a greater thermal load, thereby allowing for uniform cooling of the thermal load across the first heat-radiating fin group and the third heat-radiating fin group. Accordingly, the second heat-radiating fin group can discharge a greater quantity of heat from the heat pipes thermally connected to the heat-radiating fin group that has the greater thermal load. Furthermore, one aspect of the present invention makes it possible for the heat from the heat pipes thermally connected to the heat-radiating fin group that has the greater thermal load to be discharged in a greater quantity by the second heat-radiating fin group, thus allowing the cooling of the plurality of heat-generating elements to be uniform as a result, and therefore making it possible to increase the long-term reliability of the heat-generating elements.

According to at least some of the aspects of the present invention, adjusting the area ratio of the first heat-radiating fins, second heat-radiating fins, and third heat-radiating fins makes it possible to cool the first heat-generating element and second heat-generating element more uniformly. In addition, in one aspect of the present invention, even if there is a deviation between the positions of the first heat-generating element and the second heat-generating element, the bending of the first heat pipes and second heat pipes makes it possible to maintain favorable thermal connectivity between the heat-generating elements and the heat pipes and to prevent a reduction in heat-dissipating efficiency.

According to at least some of the aspects of the present invention, when the heat pipes are introduced in a direction angled with respect to the direction in which the heat-radiating fins are arranged, cooling air that has been transmitted in a direction parallel or generally parallel to the surface of the heat-radiating fins can cool not only the other end of the heat pipes thermally connected to the heat-radiating fin group, but also the center section of the heat pipes.

According to at least some of the aspects of the present invention, forming the first heat pipe group and/or the second heat pipe group makes it possible to reliably perform cooling even if the amount of heat generated by the first heat-generating element and/or second heat-generating element increases. Moreover, adjusting the number of the first heat pipes constituting the first heat pipe group and the number of the second heat pipes constituting the second heat pipe group can make the cooling of both heat-generating elements uniform even if the amount of heat generated by the first heat-generating element differs from the second heat-generating element.

According to at least some of the aspects of the present invention, when the first heat pipes overlap the second heat pipes in a plan view saves space in the cooling device, the arrangement space for the center area of the heat pipes can be saved, and the cooling air transmitted in the direction parallel or generally parallel to the surface of the heat-radiating fins can cool the center of the heat pipes.

According to at least some of the aspects, having a bend in the section of the heat pipes thermally connecting to the heat-radiating fins makes it possible to reduce the dimensions of the heat pipes in the long-axis direction while thermally connecting the heat pipes to the respective plurality of heat-radiating fins that constitute the heat-radiating fin groups.

According to at least some of the aspects, when the portions of the heat pipe groups thermally connected to the heat-radiating fins are arranged with left-right symmetry, it is possible for the respective heat-radiating fins constituting the heat-radiating fin groups to more reliably contribute to the cooling of the heat-generating elements.

According to at least some of the aspects, when the portions of the heat pipes thermally connected to the heat-radiating fin groups are flattened, it is possible to further increase the contact area of the heat pipes with respect to the heat-radiating fins and to further improve cooling efficiency.

Furthermore, the flattening can further reduce pressure loss of cooling air within the heat-radiating fin groups.

It is to be understood that both the foregoing general description and the following detailed description are exemplary and explanatory, and are intended to provide further explanation of the invention as claimed.

BRIEF DESCRIPTION OF THE DRAWINGS

FIG. 18 is a table showing evaluation results of the working example and comparative example.

DETAILED DESCRIPTION OF EMBODIMENTS

Figure 1:
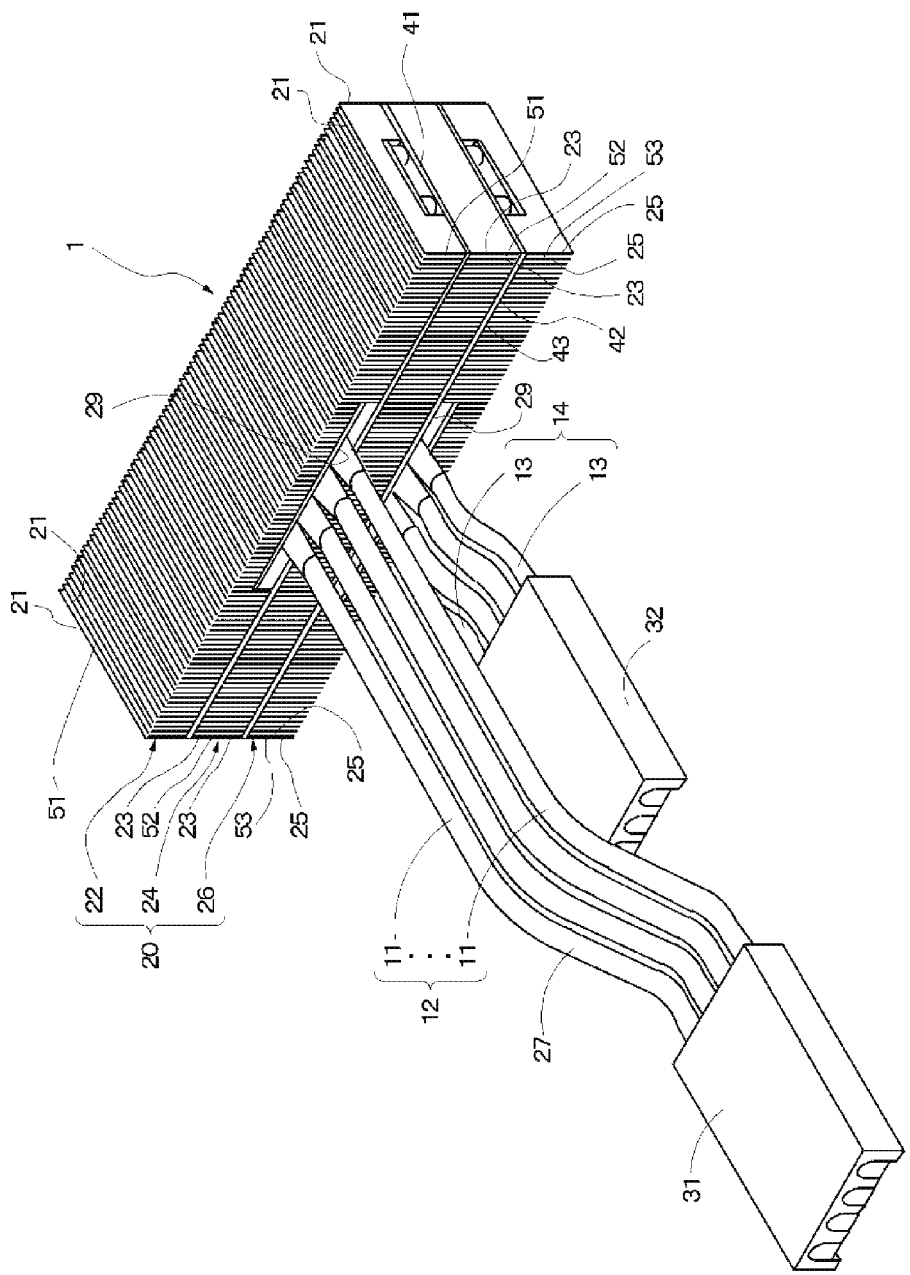
FIG. 1 is a perspective view of a cooling device according to Embodiment 1 of the present invention.

A cooling device according to Embodiment 1 of the present invention will be explained below with reference to the drawings. As shown in FIG. 1, the cooling device 1 of Embodiment 1 includes first heat pipes 11 thermally connected to a first heat-generating element (not shown), and second heat pipes 13 thermally connected to a second heat-generating element (not shown). The first heat pipes 11 and second heat pipes 13 are all thermally connected to a common heat sink 20 of the cooling device 1. The heat sink 20 includes a first heat-radiating fin group 22, a second heat-radiating fin group 24, and a third heat-radiating fin group 26.

In FIG. 1, of the first heat-radiating fin group 22, second heat-radiating fin group 24, and third heat-radiating fin group 26, the first heat-radiating fin group 22 is positioned the furthest above the installation plane of the heat-generating elements, and the third heat-radiating fin group 26 is positioned the closest to the installation plane of the heat-generating elements.

The first heat pipes 11 receive the heat emitted from the first heat-generating element at one end and transfer the heat toward the first heat-radiating fin group 22 and second heat-radiating fin group 24 that are part of the heat sink 20 of the cooling device 1 and that are thermally connected to the other end of the first heat pipes 11. The heat that has been transferred from the first heat-generating element to the first heat-radiating fin group 22 and second heat-radiating fin group 24 via the first heat pipes 11 is emitted to outside from the first heat-radiating fin group 22 and the second heat-radiating fin group 24. The second heat pipes 13 receive the heat emitted from the second heat-generating element at one end and transfer the heat toward the second heat-radiating fin group 24 and third heat-radiating fin group 26 that are part of the heat sink 20 of the cooling device 1 and that are thermally connected to the other end of the second heat pipes 13. The heat that has been transferred from the second heat-generating element to the second heat-radiating fin group 24 and third heat-radiating fin group 26 via the second heat pipes 13 is emitted to outside from the second heat-radiating fin group 24 and the third heat-radiating fin group 26.

Figure 2:
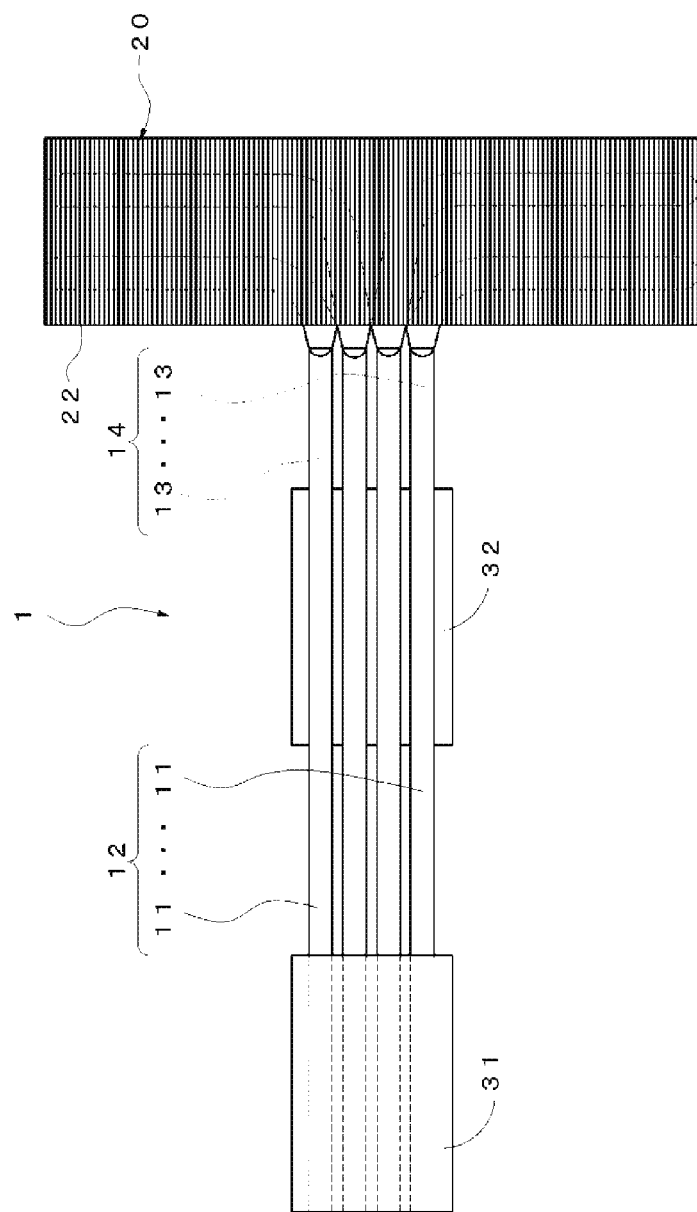
FIG. 2 is a plan view of the cooling device according to Embodiment 1 of the present invention.
Figure 3:
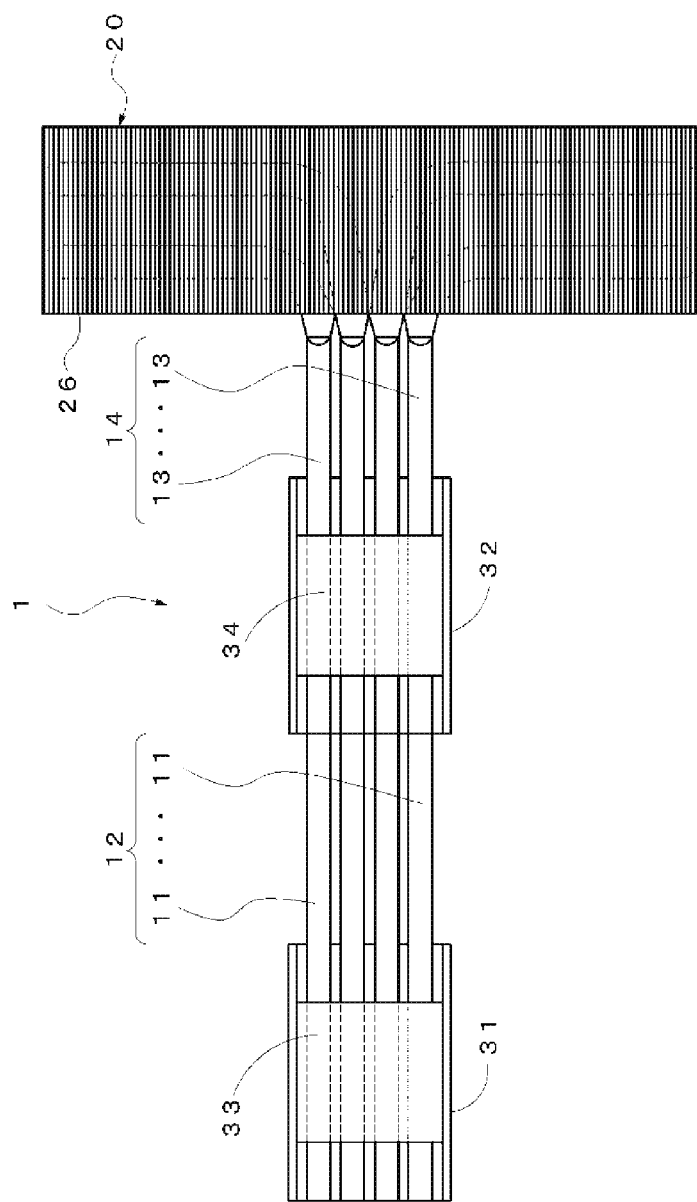
FIG. 3 is a bottom view of the cooling device according to Embodiment 1 of the present invention.

As shown in FIGS. 1, 2, and 3, the first heat pipes 11 are arranged in a plurality (four in the drawings) in parallel in a direction that is orthogonal to the long-axis direction of the first heat pipes, thereby forming a first heat pipe group 12. The plurality of first heat pipes 11 all face other adjacent first heat pipes 11 at the sides thereof. Furthermore, the plurality of first heat pipes 11 all have one end thermally connected to the first heat-generating element (not shown), thus thermally connecting one end of the first heat pipe group 12 to the first heat-generating element. In the cooling device 1, the one end of the first heat pipe group 12 directly or indirectly contacting the surface of the first heat-generating element via a first cover 31 causes the one end of the first heat pipe group 12 to be thermally connected to the first heat-generating element.

As shown in FIGS. 1, 2, and 3, the second heat pipes 13 are arranged in a plurality (four in the drawings) in parallel in a direction that is orthogonal to the long-axis direction of the second heat pipes, thereby forming a second heat pipe group 14. The plurality of second heat pipes 13 all face other adjacent second heat pipes 13 at the sides thereof. Furthermore, the plurality of second heat pipes 13 all have one end thermally connected to the second heat-generating element (not shown), thus thermally connecting one end of the second heat pipe group 14 to the second heat-generating element. In the cooling device 1, the one end of the second heat pipe group 14 directly or indirectly contacting the surface of the second heat-generating element via a second cover 32 causes the one end of the second heat pipe group 14 to be thermally connected to the second heat-generating element.

Figure 6:
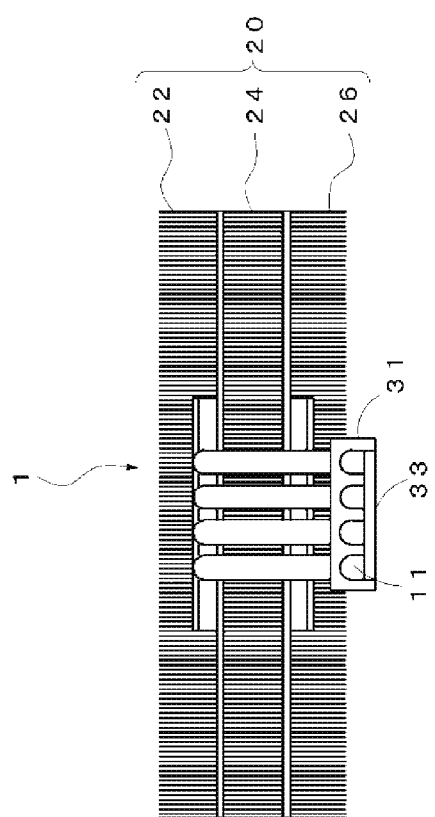
FIG. 6 is a rear view of the cooling device according to Embodiment 1 of the present invention.

Moreover, as shown in FIG. 6, in the cooling device 1, one end of the first heat pipes 11, which are round containers of a tubular material, has the side facing the first heat-generating element deformed into a planar shape, thus assuming a reversed "U"-shape in a rear view. Furthermore, one end of the second heat pipes 13, which are round containers of a tubular material, has the side facing the second heat-generating element deformed into a planar shape, thus assuming a reversed "U"-shape in a rear view. It should be noted that, in order to improve thermal connectivity, a heat-receiving plate may be disposed between the heat pipe group and the heat-generating element to indirectly connect the heat pipe group to the heat-generating element, and in the cooling device 1, a heat-receiving plate 33 is disposed between the rear view reversed "U"-shape planar portion of the first heat pipes 11 and the first heat-generating element, and a heat-receiving plate 34 is disposed between the rear view reversed "U"-shaped planar portion of the second heat pipes 13 and the second heat-generating element. The method of fixing the cover that connects the heat pipe group to the heat-generating element has no particular limitations, and can be a screw or the like, for example.

As shown in FIGS. 1, 2, and 3, in the cooling device 1, the first cover 31 to which the first heat pipe group 12 is thermally connected and the second cover 32 to which the second heat pipe group 14 is thermally connected are arranged on the same straight line (on the same plane) in order to correspond to the first heat-generating element and the second heat-generating element being arranged on the same straight line (on the same plane). In the cooling device 1, the straight line connecting the first cover 31 and the second cover 32 intersects the lengthwise direction of the heat sink 20, which has a generally cuboid external shape. Moreover, the straight line connecting the first cover 31 and the second cover 32 intersects the center of the lengthwise direction of the heat sink 20. In the cooling device 1, the second cover 32 is disposed closer to the heat sink 20 than the first cover 31.

As described above, the other end of the first heat pipes 11 is thermally connected to the first heat-radiating fin group 22 and the second heat-radiating fin group 24, thereby thermally connecting the other end of the first heat pipe group 12 to the first heat-radiating fin group 22 and the second heat-radiating fin group 24. Furthermore, the other end of the second heat pipes 13 is thermally connected to the second heat-radiating fin group 24 and the third heat-radiating fin group 26, thereby thermally connecting the other end of the second heat pipe group 14 to the second heat-radiating fin group 24 and the third heat-radiating fin group 26. In addition, the portion (center area) between the one end and the other end of both the first heat pipe group 12 and the second heat pipe group 14 has a linear shape in a plan view.

The second cover 32 is disposed closer to the heat sink 20 than the first cover 31; therefore, the first heat pipe group 12 is longer than the second heat pipe group 14. Moreover, the first heat pipe group 12 has a stepped portion 27 for avoiding the second cover 32 and the portion between the one end and the other end of the second heat pipe group 14. The stepped portion 27 makes it possible for the portion between the one end and the other end of the first heat pipe group 12 to be positioned on top of the second cover 32 and on top of the portion between the one end and the other end of the second heat pipe group 14.

Accordingly, as shown in FIGS. 2 and 3, the portion between the one end and other end of the second heat pipe group 14 is in a positional relationship that overlaps the portion between the one end and other end of the first heat pipe group 12 in a plan view and bottom view.

Even if a deviation were to occur between the position of the first heat-generating element and the position of the second heat-generating element, the portion between the one end and other end of the first heat pipe group 12 (e.g., the stepped portion 27) and the portion between the one end and other end of the second heat pipe group 14 would bend, thus making it possible to maintain favorable thermal connectivity between the heat-generating elements and the first heat pipe group 12 and second heat pipe group 14, and making it possible to prevent a reduction in heat-dissipating efficiency. The portion between the one end and other end of the second heat pipe group 14 is in a positional relationship that overlaps the portion between the one end and other end of the first heat pipe group 12 in a plan view and bottom view, which also makes it possible to save space with respect to the arrangement area for the heat pipes.

As shown in FIG. 1, the heat sink 20 having a generally cuboid external shape includes the first heat-radiating fin group 22 having a generally cuboid external shape, the second heat-radiating fin group 24 having a generally cuboid external shape adjacent to the first heat-radiating fin group 22, and the third heat-radiating fin group 26 having a generally cuboid external shape adjacent to the second heat-radiating fin group 24. Moreover, the first heat-radiating fin group 22, second heat-radiating fin group 24, and third heat-radiating fin group 26 are layered on top of one another. In other words, in the cooling device of the present invention, the heat sink has a multilayer structure due to having a plurality of heat-radiating fin groups, and the heat sink 20 of the cooling device 1 has three heat-radiating fin groups, and is thus a three-layer multilayer structure.

The first heat-radiating fin group 22 includes a first support member 41 and a plurality of first heat-radiating fins 21. The first heat-radiating fins 21 attaching to the first support member 41 thermally connects the first heat-radiating fins 21 to the first support member 41. Furthermore, the first heat-radiating fins 21 are each arrayed in a direction parallel to the lengthwise direction of the heat sink 20. In addition, the first heat-radiating fins 21 are attached to the first support member 41 such that the surfaces of the first heat-radiating fins are parallel to the plan view linearly shaped portions between the one end and other end of the first heat pipe group 12 and second heat pipe group 14. Accordingly, the surfaces of the first heat-radiating fins 21 form the widthwise direction of the heat sink 20 and first heat-radiating fin group 22.

The second heat-radiating fin group 24 includes a second support member 42 and a plurality of second heat-radiating fins 23. The second heat-radiating fins 23 attaching to the second support member 42 thermally connects the second heat-radiating fins 23 to the second support member 42. Furthermore, the second heat-radiating fins 23 are each arrayed in a direction parallel to the lengthwise direction of the heat sink 20. In addition, the second heat-radiating fins 23 are attached to the second support member 42 such that the surfaces of the second heat-radiating fins are parallel to the plan view linearly shaped portions between the one end and other end of the first heat pipe group 12 and second heat pipe group 14. Accordingly, the surfaces of the second heat-radiating fins 23 form the widthwise direction of the heat sink 20 and second heat-radiating fin group 24.

The other end of the first heat pipe group 12 is disposed between the first heat-radiating fin group 22 and second heat-radiating fin group 24. The other end of the first heat pipe group 12 directly or indirectly contacting the first heat-radiating fin group 22 and second heat-radiating fin group 24 thermally connects the first heat pipe group 12 to the first heat-radiating fin group 22 and second heat-radiating fin group 24. In other words, the heat sink 20 has the first heat-radiating fin group 22 and second heat-radiating fin group 24 formed on the boundary of the other end of the first heat pipe group 12, and the second heat-radiating fin group 24 faces the first heat-radiating fin group 22 across the first heat pipe group 12. In addition, in the cooling device 1, the top of the second heat-radiating fins 23 contacts the first support member 41, and thus the first heat-radiating fins 21 and second heat-radiating fins 23 are thermally connected via the first support member 41.

Furthermore, the first heat-radiating fin group 22 has a first opening 51 between the first heat-radiating fins 21 and other adjacent first heat-radiating fins 21, and the first heat pipe group 12 is introduced into the heat sink 20, or namely, the space between the first heat-radiating fin group 22 and second heat-radiating fin group 24, in a direction that is angled (here in this example, a perpendicular direction, that is parallel to the surface of the fins 21) with respect to a direction along which the plurality of first heat-radiating fins 21 are arranged. In a similar manner, the second heat-radiating fin group 24 has a second opening 52 between the second heat-radiating fins 23 and other adjacent second heat-radiating fins 23, and the first heat pipe group 12 is introduced into the heat sink 20, or namely, the space between the first heat-radiating fin group 22 and second heat-radiating fin group 24, in a direction that is angled (here in this example, a perpendicular direction, that is parallel to the surface of the fins 23) with respect to a direction along which the plurality of second heat-radiating fins 23 are arranged.

The surface of the first heat-radiating fins 21 and the surface of the second heat-radiating fins 23 are disposed in a direction parallel to the plan view linearly shaped portions between the one end and other end of the first heat pipe group 12 and second heat pipe group 14; thus, both the first opening 51 and second opening 52 open in a direction parallel to the portions between the one end and other end of the first heat pipe group 12 and second heat pipe group 14.

Accordingly, in the cooling device 1, the first heat pipe group 12 is introduced into the heat sink 20 from the direction parallel to the first opening 51 and second opening 52, or namely, from the direction orthogonal to the lengthwise direction of the heat sink 20.

The third heat-radiating fin group 26 includes a third support member 43 and a plurality of third heat-radiating fins 25. In this example, the second support member 42 and third support member 43 are the same single member; i.e., the third support member 43 is identical to the second support member 42. The third heat-radiating fins 25 attaching to the third support member 43 thermally connects the third heat-radiating fins 25 to the third support member 43. Furthermore, the third heat-radiating fins 25 are each arrayed in a direction parallel to the lengthwise direction of the heat sink 20. In addition, the third heat-radiating fins 25 are attached to the third support member 43 such that the surfaces of the third heat-radiating fins are parallel to the plan view linearly shaped portions between the one end and other end of the first heat pipe group 12 and second heat pipe group 14. Accordingly, the surfaces of the third heat-radiating fins 25 form the widthwise direction of the heat sink 20 and third heat-radiating fin group 26.

The other end of the second heat pipe group 14 is disposed between the second heat-radiating fin group 24 and third heat-radiating fin group 26. The other end of the second heat pipe group 14 directly or indirectly contacting the second heat-radiating fin group 24 and third heat-radiating fin group 26 thermally connects the second heat pipe group 14 to the second heat-radiating fin group 24 and third heat-radiating fin group 26. In other words, the heat sink 20 has the second heat-radiating fin group 24 and third heat-radiating fin group 26 formed on the boundary of the other end of the second heat pipe group 14, and the second heat-radiating fin group 24 faces the third heat-radiating fin group 26 across the second heat pipe group 14. In addition, in the cooling device 1, the top of the third heat-radiating fins 25 contacts the second support member 42, and thus the second heat-radiating fins 23 and third heat-radiating fins 25 are thermally connected via the second support member 42.

Accordingly, the second heat-radiating fin group 24 is positioned between the second heat pipe group 14 and the first heat pipe group 12.

Furthermore, the third heat-radiating fin group 26 has a third opening 53 between the third heat-radiating fins 25 and other adjacent third heat-radiating fins 25, and the second heat pipe group 14 is introduced into the heat sink 20, or namely, the space between the second heat-radiating fin group 24 and third heat-radiating fin group 26, in a direction that is angled (here in this example, a perpendicular direction, that is parallel to the surface of the fins 25) with respect to a direction along which the plurality of third heat-radiating fins 25 are arranged.

The surface of the third heat-radiating fins 25 are disposed in a direction parallel to the plan view linearly shaped portions between the one end and other end of the first heat pipe group 12 and second heat pipe group 14; thus, the third opening 53 also opens in a direction parallel to the portions between the one end and other end of the first heat pipe group 12 and second heat pipe group 14.

Accordingly, in the cooling device 1, the second heat pipe group 14 is introduced into the heat sink 20 from the direction parallel to the second opening 52 and third opening 53, or namely, from the direction orthogonal to the lengthwise direction of the heat sink 20.

As shown in FIG. 1, in the cooling device 1, the first heat-radiating fin group 22 is positioned furthest above the installation plane of the heat-generating element, and the third heat-radiating fin group 26 is positioned closest to the installation plane of the heat-generating element; therefore, the other end of the first heat pipe group 12 is introduced into the heat sink 20 above the other end of the second heat pipe group 14.

As shown in FIG. 2, in the cooling device 1, the four first heat pipes 11 constituting the first heat pipe group 12 have a bend at the portion that is thermally connected to the first heat-radiating fin group 22 and second heat-radiating fin group 24—i.e., the portions sandwiched between the first heat-radiating fin group 22 and the second heat-radiating fin group 24. Accordingly, the first heat pipes 11 all have a generally "L"-shape in a plan view in these portions. Furthermore, the two first heat pipes 11 on the right side are bent to the right direction, whereas the two first heat pipes 11 on the left side are bent to the left direction. In other words, the first heat pipes 11 on the left side and the first heat pipes 11 on the right side have bends with bending directions that are opposite of each other.

Figure 4:
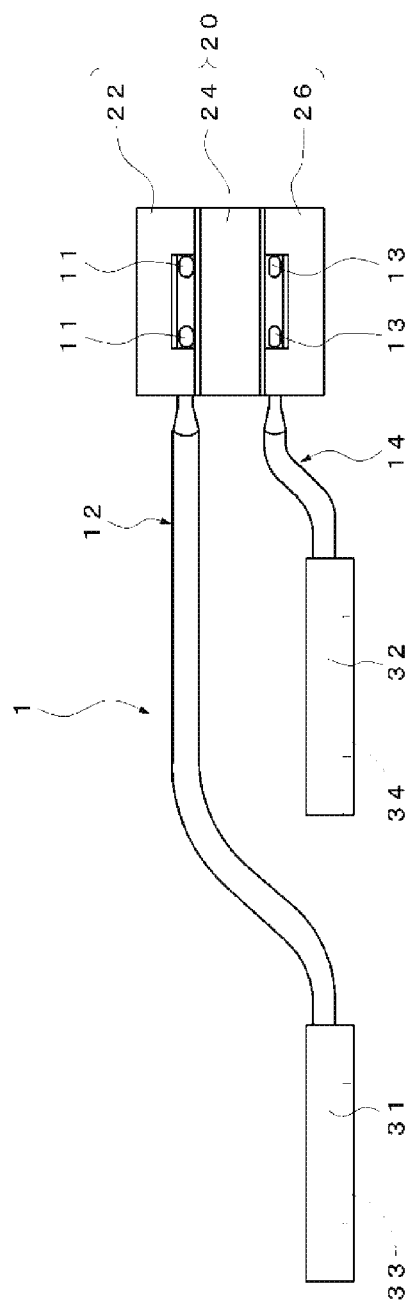
FIG. 4 is a side view of the cooling device according to Embodiment 1 of the present invention.
Figure 5:
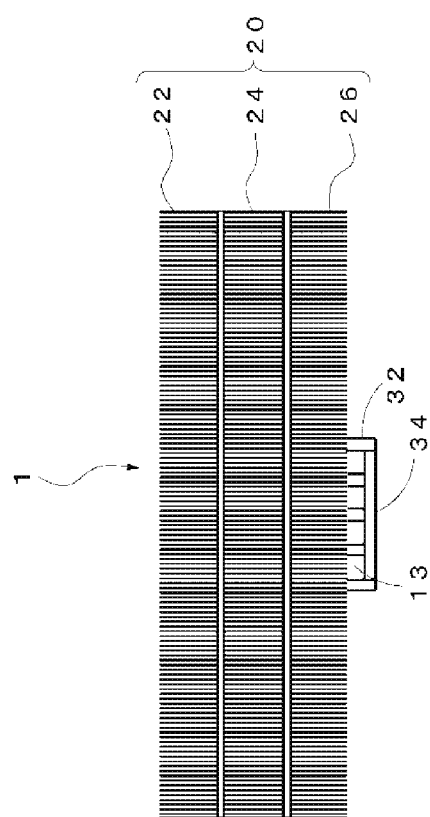
FIG. 5 is a front view of the cooling device according to Embodiment 1 of the present invention.

Thus, as shown in FIGS. 2 and 4, the four first heat pipes 11 all have the other ends thereof extending in the direction parallel to the lengthwise direction of the heat sink 20 due to the bends. In the cooling device 1, the other ends of the first heat pipes 11 extending in the direction parallel to the lengthwise direction of the heat sink 20 all reach the ends of the heat sink 20 in the lengthwise direction.

Furthermore, as shown in FIG. 2, the radius of curvature of the bends of the first heat pipes 11 positioned on both ends of the first heat pipe group 12 is less than the radius of curvature of the bends of the adjacent first heat pipes 11, and the first heat pipes 11 positioned closer inside the first heat pipe group 12 have a correspondingly greater radius of curvature of the bends thereof. Moreover, the other end of the first heat pipe group 12 thermally connected to the first heat-radiating fin group 22 and second heat-radiating fin group 24 is arranged so as to have left-right symmetry about the centerline in the lengthwise direction of the heat sink 20 in a plan view. Accordingly, the heat-radiating fins constituting the first heat-radiating fin group 22 and second heat-radiating fin group 24 reliably contribute to cooling of the heat-generating element, and thus heat can be efficiently dissipated at the entirety of the first heat-radiating fin group 22 and second heat-radiating fin group 24.

As shown in FIG. 3, in the cooling device 1, the four second heat pipes 13 constituting the second heat pipe group 14 have a bend at the portion that is thermally connected to the second heat-radiating fin group 24 and third heat-radiating fin group 26. Accordingly, the second heat pipes 13 all have a generally "L"-shape in a plan view. Furthermore, the two second heat pipes 13 on the right side are bent to the right direction, whereas the two second heat pipes 13 on the left side are bent to the left direction. In other words, the second heat pipes 13 on the left side and the second heat pipes 13 on the right side have bends with bending directions that are opposite of each other.

Thus, as shown in FIGS. 3 and 4, the four second heat pipes 13 all have the other ends thereof extending in the direction parallel to the lengthwise direction of the heat sink 20 due to the bends. In the cooling device 1, the other ends of the second heat pipes 13 extending in the direction parallel to the lengthwise direction of the heat sink 20 all reach the ends of the heat sink 20 in the lengthwise direction.

Furthermore, as shown in FIG. 3, the radius of curvature of the bends of the second heat pipes 13 positioned on both ends of the second heat pipe group 14 is less than the radius of curvature of the bends of the adjacent second heat pipes 13, and the second heat pipes 13 positioned closer inside the second heat pipe group 14 have a correspondingly greater radius of curvature of the bends thereof. Moreover, the other end of the second heat pipe group 14 thermally connected to the second heat-radiating fin group 24 and third heat-radiating fin group 26 is arranged so as to have left-right symmetry about the centerline in the lengthwise direction of the heat sink 20 in a bottom view. Accordingly, the heat-radiating fins constituting the second heat-radiating fin group 24 and third heat-radiating fin group 26 reliably contribute to cooling of the heat-generating element, and thus heat can be efficiently dissipated at the entirety of the second heat-radiating fin group 24 and third heat-radiating fin group 26.

As shown in FIG. 1, in the cooling device 1, the side of the first heat-radiating fins 21 facing the second heat-radiating fin group 24 has a cutout part 29 corresponding to the size and shape of the other end of the first heat pipe group 12, and the other end of the first heat pipe group 12 is introduced into the heat sink 20 via the cutout part 29. Furthermore, the side of the third heat-radiating fins 25 facing the second heat-radiating fin group 24 has a cutout part 29 corresponding to the size and shape of the other end of the second heat pipe group 14, and the other end of the second heat pipe group 14 is introduced into the heat sink 20 via the cutout part 29.

In the cooling device 1, the first heat pipes 11 and second heat pipes 13 are round containers of a tubular material, and as shown in FIG. 4, the other end of the first heat pipes 11 thermally connected to the heat sink 20 and the other end of the second heat pipes 13 thermally connected to the heat sink 20 are flattened. The flattening increases the contact area of the first heat pipes 11 and second heat pipes 13 with respect to the heat sink 20, which makes it possible to improve cooling efficiency. Furthermore, the flattening can reduce pressure loss of cooling air within the heat sink 20.

In the cooling device 1, the first heat pipes 11 constituting the first heat pipe group 12 all have the same diameter, and the second heat pipes 13 constituting the second heat pipe group 14 all have the same diameter. Moreover, the diameters of the first heat pipes 11 and the diameters of the second heat pipes 13 are all the same.

The material of the first heat-radiating fins 21, second heat-radiating fins 23, and third heat-radiating fins 25 has no particular limitations, and examples include a metal such as copper, copper alloy, aluminum, aluminum alloy, or the like. In the cooling device 1, the heat sink 20 has excellent heat-dissipating efficiency; thus, by using aluminum, which has inferior thermal conductivity compared to copper but is light-weight, it is possible to maintain the favorable heat-dissipating efficiency of the cooling device while making the cooling device light-weight. In addition, the material of the first support member 41, second support member 42, third support member 43, first cover 31, and second cover 32 has no particular limitations, and examples include a metal such as copper, copper alloy, aluminum, aluminum alloy, or the like.

Furthermore, the material of the container of the first heat pipes 11 and second heat pipes 13 has no particular limitations, and examples include a metal such as copper, copper alloy, aluminum, aluminum alloy, stainless steel, and the like. Moreover, the working fluid sealed in the first heat pipes 11 and second heat pipes 13 can be water, a chlorofluorocarbon alternative, perfluorocarbon, cyclopentane, or the like.

As described above, in the cooling device 1, the first heat pipe group 12 thermally connected to the first heat-generating element and the second heat pipe group 14 thermally connected to the second heat-generating element are both thermally connected to the second heat-radiating fin group 24. Accordingly, even if the difference between the amount of heat generated by the first heat-generating element and the amount of heat generated by the second heat-generating element causes the amount of heat received by the first heat-radiating fin group 22 to differ from the amount of heat received by the third heat-radiating fin group 26, the second heat-radiating fin group 24 can receive heat from whichever heat pipe group thermally connected to the heat-radiating fin group has received a relatively greater heat load among the first heat-radiating fin group 22 and third heat-radiating fin group 26; thus, it is possible to make the thermal load of the first heat-radiating fin group 22 and third heat-radiating fin group 26 uniform, which makes it possible to have uniform cooling of the first heat-generating element and the second heat-generating element.

In addition, by introducing the first heat pipe group 12 and second heat pipe group 14 into the heat sink 20 in a direction parallel or generally parallel to the surface of the first heat-radiating fins 21, second heat-radiating fins 23, and third heat-radiating fins 25, a cooling wind (from a fan, for example) supplied in such a direction can cool not only the heat sink 20 and the other ends of the first heat pipe group 12 and second heat pipe group 14 thermally connected to the heat sink 20, but also the portions between the one ends and other ends of the first heat pipe group 12 and second heat pipe group 14.

Furthermore, in the embodiment of the cooling device 1, the area ratio of the first heat-radiating fins 21, second heat-radiating fins 23, and third heat-radiating fins 25 may preferably be approximately 1:1.5:1, but the area ratio can be selected as appropriate in accordance with the difference in heat generated between the first heat-generating element and the second heat-generating element, and appropriately adjusting the area ratio can make it possible to further make the cooling of the first heat-generating element and second heat-generating element uniform.

Next, a cooling device according to Embodiment 2 of the present invention will be described with reference to the drawings. Components that are the same as those in the cooling device 1 of Embodiment 1 are assigned the same reference characters.

Figure 7:
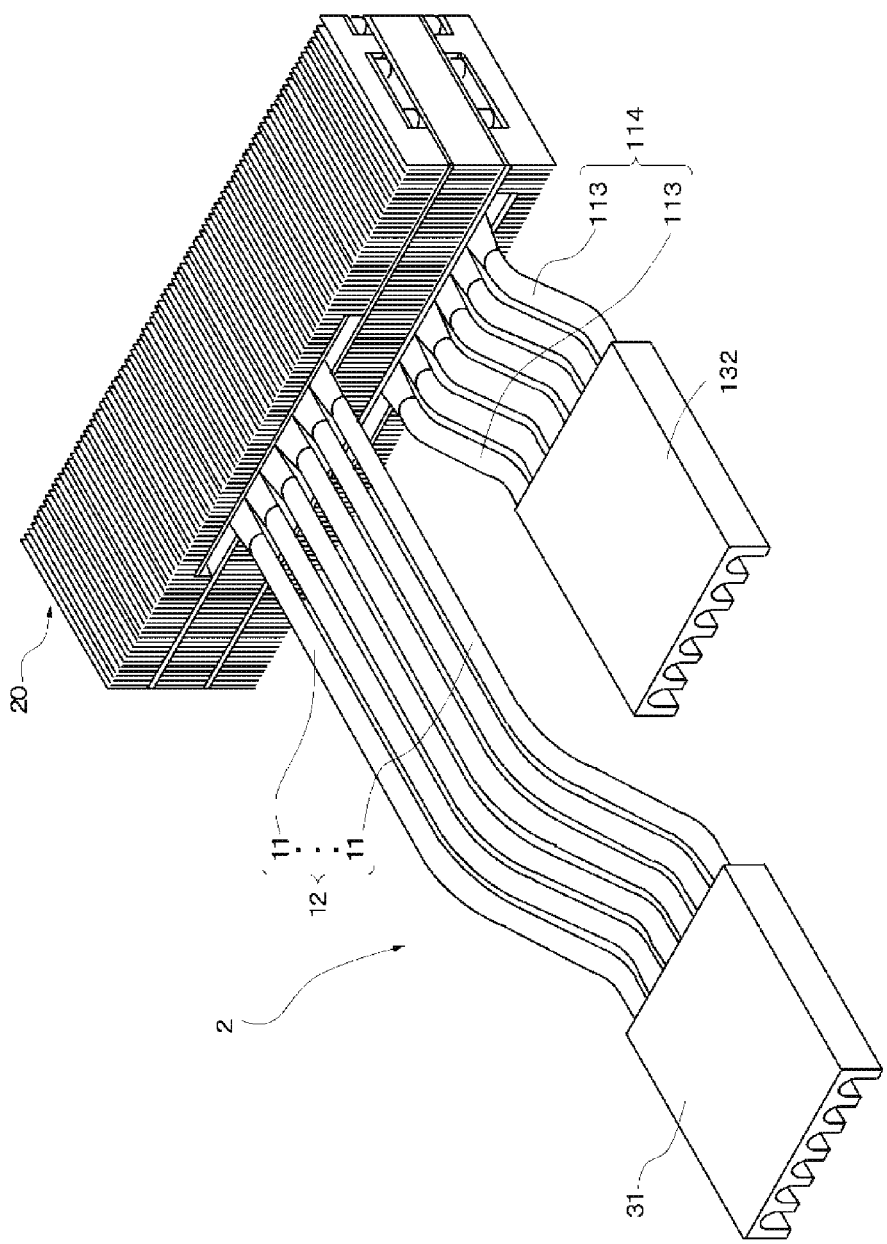
FIG. 7 is a perspective view of a cooling device according to Embodiment 2 of the present invention.

As shown in FIG. 7, the cooling device 2 of Embodiment 2 has a positional relationship configured such that portions between one end and another end of a second heat pipe group 114 that has a plurality (six in the drawing) of second heat pipes 113 do not overlap in a plan view portions between one end and another end of a first heat pipe group 12 that has a plurality of first heat pipes 11 (six in the drawing). In other words, the first heat-generating element and second heat-generating element are on the same plane, but are not on the same straight line intersecting with the lengthwise direction of the heat sink 20, which has a generally cuboid external shape. Based on this, in the cooling device 1, a first cover 31 thermally connected to the first heat pipe group 12 and a second cover 132 thermally connected to the second heat pipe group 114 are not placed on the same straight line mentioned above.

In the cooling device 2, in a similar manner to the cooling device 1, the first heat pipe group 12 is introduced into the heat sink 20, or namely, into a space between the first heat-radiating fin group 22 and second heat-radiating fin group 24, from the center of the lengthwise direction of the heat sink 20. Meanwhile, the second heat pipe group 114 is introduced into the heat sink 20, or namely, into a space between the second heat-radiating fin group 24 and third heat-radiating fin group 26 not from the center in the lengthwise direction of the heat sink 20, but rather from the vicinity of an end of the heat sink.

Accordingly, while not shown in the drawing, the first heat pipe group 12 has the first heat pipes 11 arranged with left-right symmetry in a plan view inside the heat sink 20, in a similar manner to the cooling device 1. However, the second heat pipe group 114 is introduced into the heat sink 20 from the vicinity of an end of the heat sink 20 in a lengthwise direction; therefore, the second heat pipes 113 have a bend at the portion thermally connected to the heat sink 20, but are not arranged with left-right symmetry in a plan view inside the heat sink 20. Moreover, in the cooling device 2, the first heat pipes 11 and second heat pipes 113, which are round containers of a tubular material, are not deformed on the end (i.e., the one end) thermally connected to the heat-generating element.

Similar to the cooling device 1 of Embodiment 1, in the cooling device 2 of Embodiment 2, even if the difference between the amount of heat generated by the first heat-generating element and the amount of heat generated by the second heat-generating element causes the amount of heat received by the first heat-radiating fin group 22 to differ from the amount of heat received by the third heat-radiating fin group 26, the second heat-radiating fin group 24 can receive heat from whichever heat pipe group thermally connected to the heat-radiating fin group has received a relatively greater thermal load among the first heat-radiating fin group 22 and third heat-radiating fin group 26; thus, it is possible to make the thermal load of the first heat-radiating fin group 22 and third heat-radiating fin group 26 uniform, which makes it possible to have uniform cooling of the first heat-generating element and the second heat-generating element.

Next, a cooling device according to Embodiment 3 of the present invention will be described with reference to the drawings. Components that are the same as those in the cooling device 1 of Embodiment 1 are assigned the same reference characters.

Figure 8:
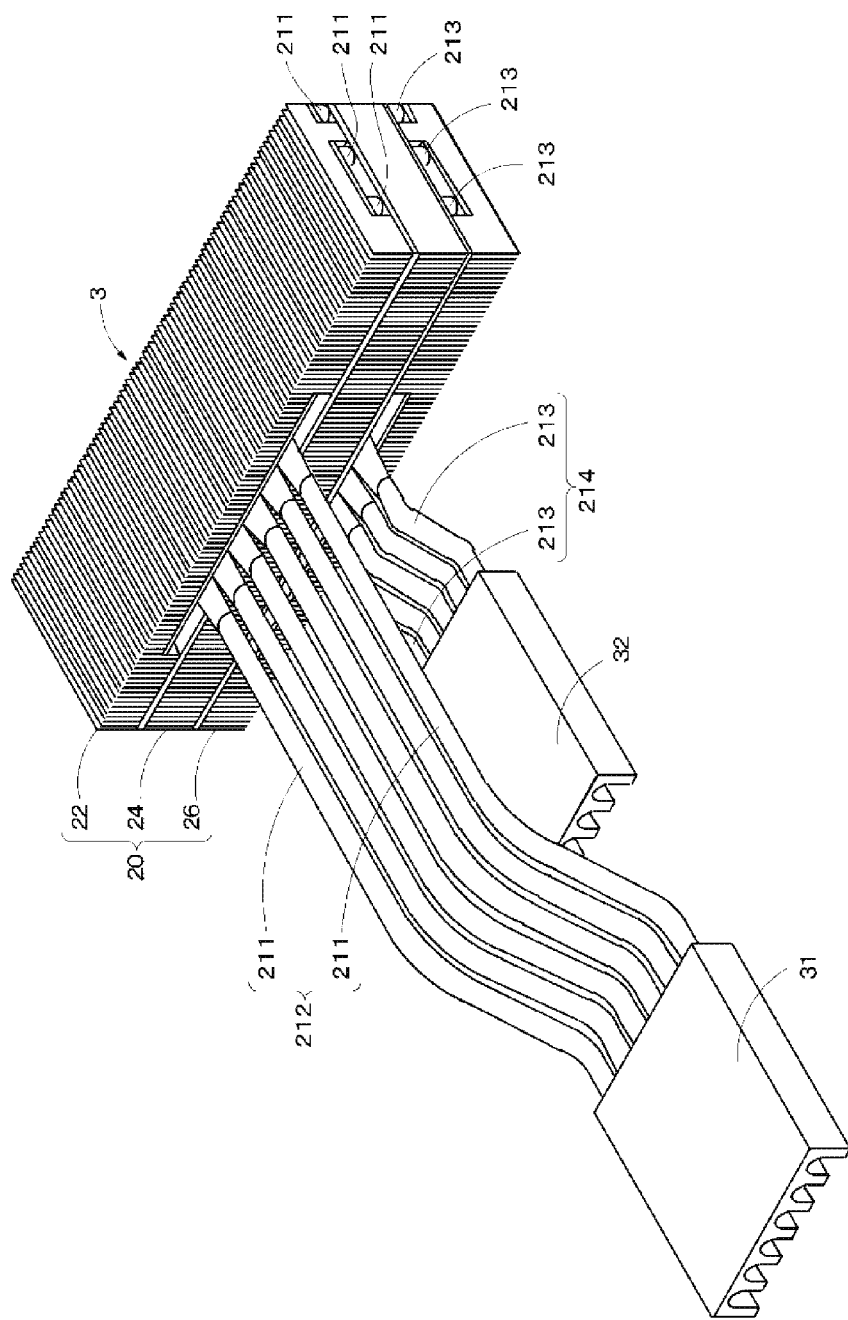
FIG. 8 is a perspective view of a cooling device according to Embodiment 3 of the present invention.
Figure 9:
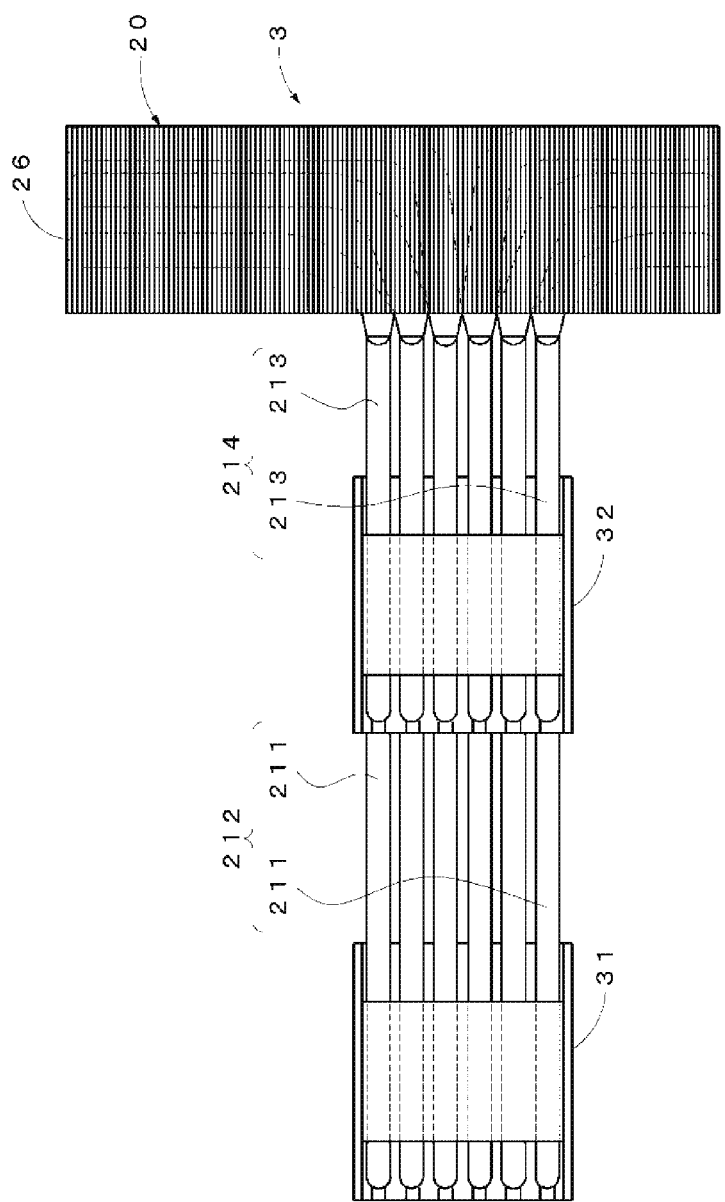
FIG. 9 is a bottom view of the cooling device according to Embodiment 3 of the present invention.

In the cooling device 1 of Embodiment 1, both the first heat pipe group 12 and second heat pipe group 14 were introduced into the heat sink 20 from the center of the heat sink 20 in the lengthwise direction, but as shown in FIGS. 8 and 9, in a cooling device 3 of Embodiment 3, both a first heat pipe group 212 and a second heat pipe group 214 are introduced into the heat sink 20 not from the center of the heat sink 20 in the lengthwise direction, but rather from the vicinity of an end of the heat sink. In the cooling device 3, both the first heat pipe group 212 and the second heat pipe group 214 are introduced into the heat sink 20 from the same vicinity of the end of the heat sink. In the cooling device 3, the first heat pipe group 212 is constituted by six first heat pipes 211, and the second heat pipe group 214 is constituted by six second heat pipes 213.

Both the first heat pipe group 212 and second heat pipe group 214 are introduced into the heat sink 20 from the vicinity of the end of the heat sink 20 in the lengthwise direction; thus, the first heat pipes 211 and second heat pipes 213 all have a bend at the portion that is thermally connected to the heat sink 20, but the first and second heat pipes are not arranged with left-right symmetry in a plan view inside the heat sink 20.

In addition, in the cooling device 3, the first heat pipes 211 and second heat pipes 213, which are round containers of a tubular material, are not deformed on the end (i.e., the one end) thermally connected to the heat-generating element. In a similar manner to the cooling device 2 of Embodiment 2, the cooling device 3 also makes it possible to make the cooling of the first heat-generating element and second heat-generating element uniform.

Next, a cooling device according to Embodiment 4 of the present invention will be described with reference to the drawings. Components that are the same as those in the cooling device 1 of Embodiment 1 are assigned the same reference characters.

Figure 10:
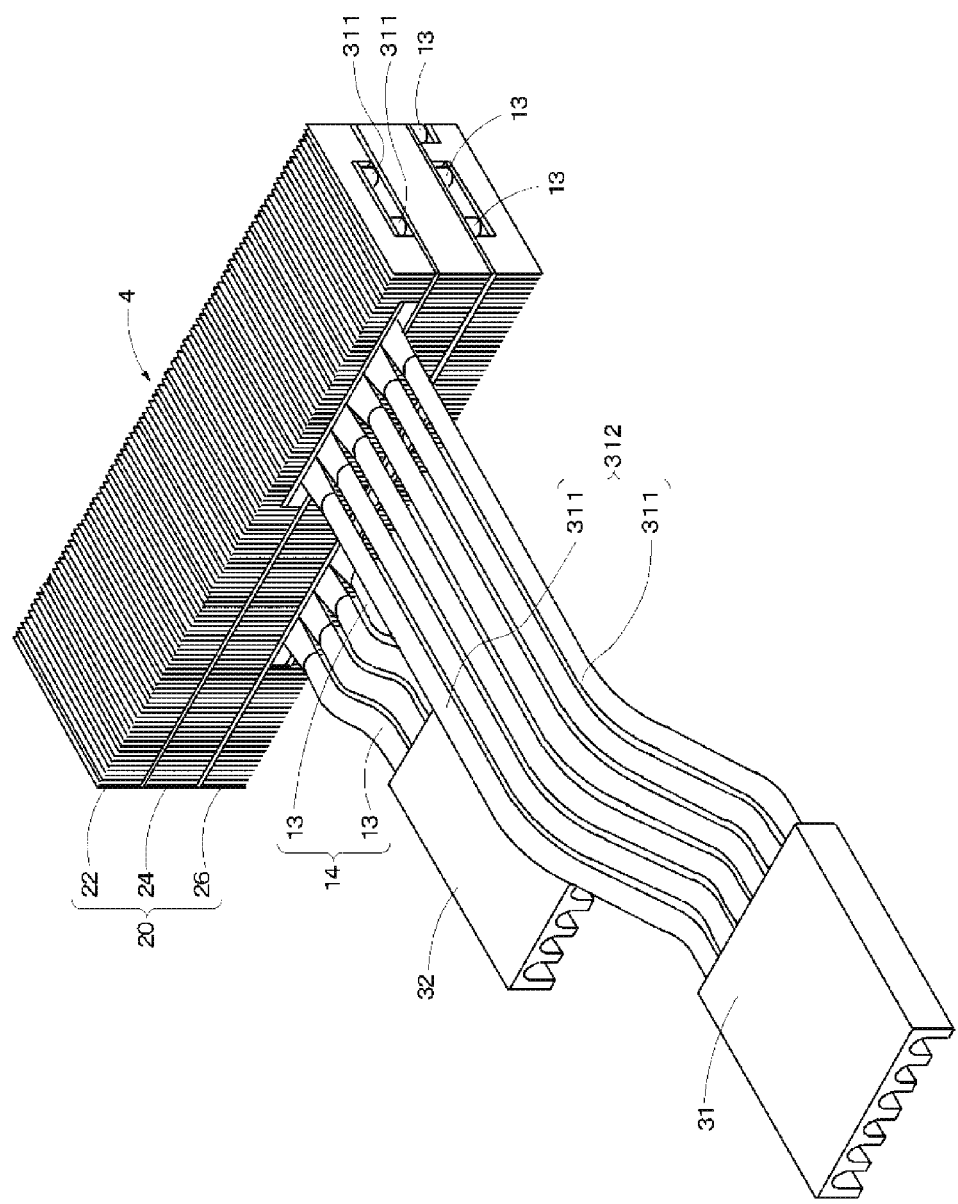
FIG. 10 is a perspective view of a cooling device according to Embodiment 4 of the present invention.
Figure 11:
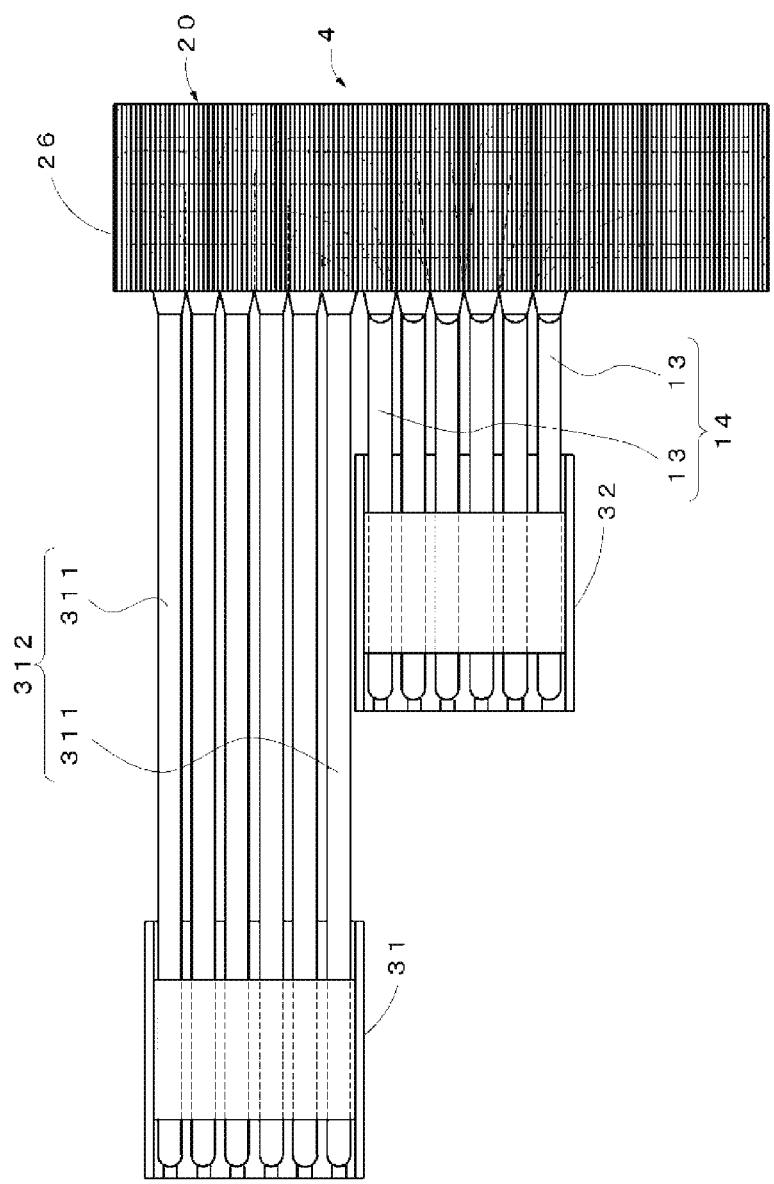
FIG. 11 is a bottom view of the cooling device according to Embodiment 4 of the present invention.

As shown in FIGS. 10 and 11, the cooling device 4 of Embodiment 4 has a positional relationship configured such that portions between one end and another end of a first heat pipe group 312 that has first heat pipes 311 do not overlap in a plan view portions between one end and another end of a second heat pipe group 14 that has second heat pipes 13. In other words, similar to the cooling device 1 of Embodiment 1, the second heat pipe group 13 is introduced into the heat sink 20 from the center of the heat sink 20 in the lengthwise direction, whereas the first heat pipe group 312 is introduced into the heat sink 20 from the vicinity of the end of the heat sink, rather than from the center of the heat sink 20 in the lengthwise direction. In the cooling device 4, the first heat pipe group 312 is constituted by six first heat pipes 311, and the second heat pipe group 14 is constituted by six second heat pipes 13.

Accordingly, in a similar manner to the cooling device 1 of Embodiment 1, the second heat pipe group 14 has the second heat pipes 13 arranged with left-right symmetry in a plan view inside the heat sink 20. However, the first heat pipe group 312 is introduced into the heat sink 20 from the vicinity of the end of the heat sink 20 in a lengthwise direction; therefore, the first heat pipes 311 have a bend at the portion thermally connected to the heat sink 20, but are not arranged with left-right symmetry in a plan view inside the heat sink 20. In the cooling device 4, the bends in the two first heat pipes 311 on the end side in the lengthwise direction of the heat sink 20 bend toward the end of the heat sink 20 in the lengthwise direction, and the bends in the four first heat pipes 311 on the center side of the heat sink 20 bend toward the center of the heat sink 20.

In addition, in the cooling device 4, the first heat pipes 311 and second heat pipes 13, which are round containers of a tubular material, are not deformed on the end (i.e., the one end) thermally connected to the heat-generating element. In a similar manner to the cooling device 2 of Embodiment 2, the cooling device 4 makes it possible to make the cooling of the first heat-generating element and second heat-generating element uniform.

Next, a cooling device according to Embodiment 5 of the present invention will be described with reference to the drawings. Components that are the same as those in the cooling device 1 of Embodiment 1 are assigned the same reference characters.

Figure 12:
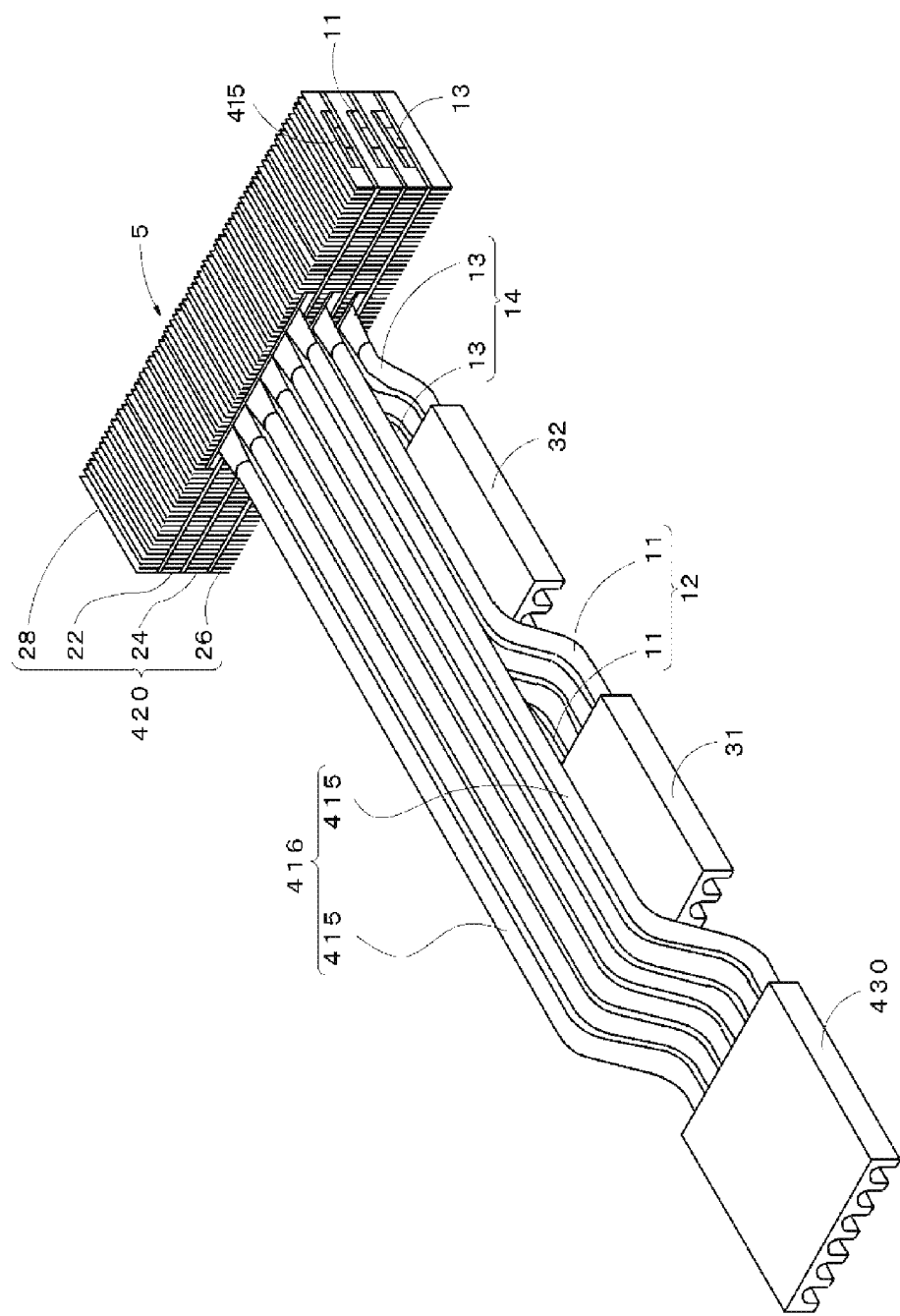
FIG. 12 is a perspective view of a cooling device according to Embodiment 5 of the present invention.
Figure 13:
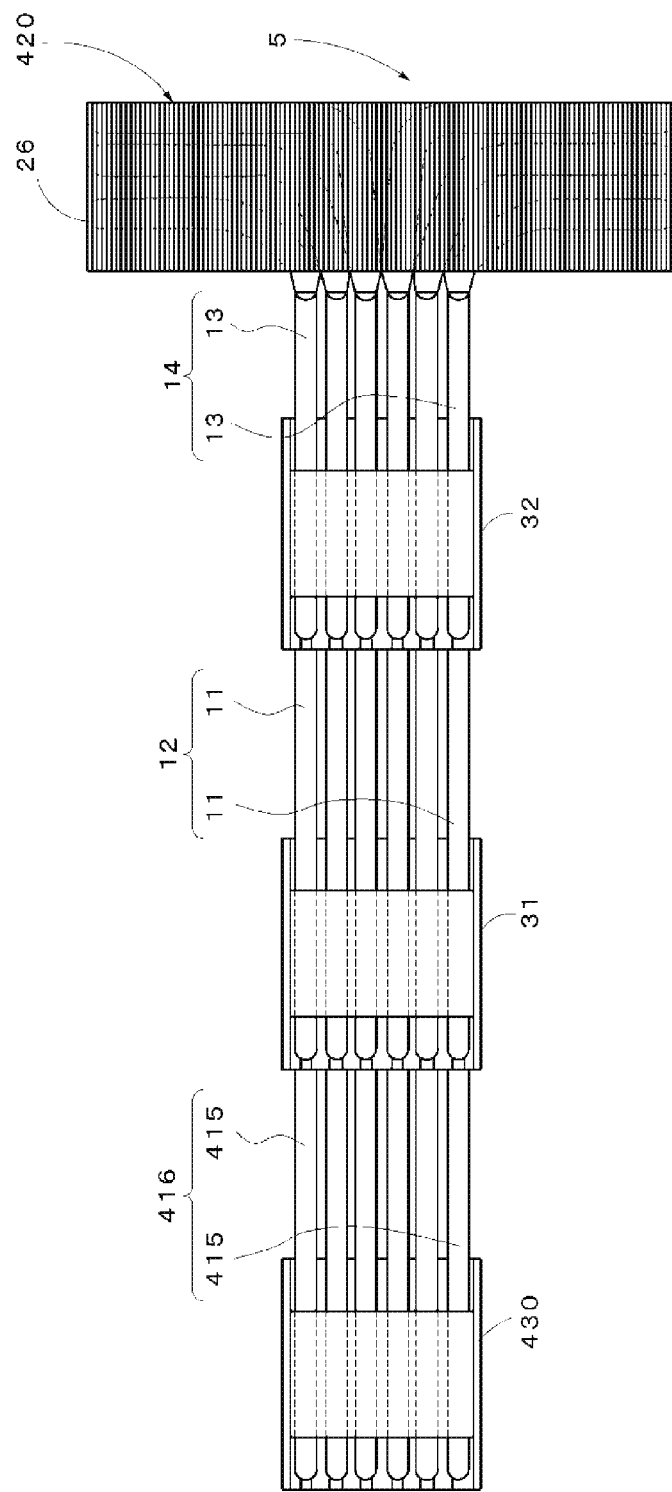
FIG. 13 is a bottom view of the cooling device according to Embodiment 5 of the present invention.

As shown in FIGS. 12 and 13, in the cooling device 5 of Embodiment 5, there are three heat-generating elements (and thus, three covers), and based on this, three heat pipe groups, with the heat sink having a four-layer structure that has four heat-radiating fin groups. In the cooling device 5, the first heat-generating element (not shown) and the second heat-generating element (not shown) are arranged on the same straight line (and on the same plane), and additionally the third heat-generating element (not shown) is also arranged on the same straight line (and on the same plane) as the first heat-generating element and the second heat-generating element; based on this, the first cover 31 thermally connected to the first heat pipe group 12 and the second cover 32 thermally connected to the second heat pipe group 14 are arranged on the same straight line (and the same plane), and additionally the third cover 430 thermally connected to the third heat pipe group 416 is also arranged on the same straight line (and on the same plane) as the first cover 31 and second cover 32.

In the cooling device 5, a plurality of the third heat pipes 415 (six in the drawings; the same as the first heat pipe group 12 and second heat pipe group 14) are arranged in parallel to each other in a direction orthogonal to the long-axis direction in order to form the third heat pipe group 416. Furthermore, in the cooling device 5, the third cover 430 is located at the position furthest from the heat sink 420, and thus the third heat pipes 415 have the longest length.

As shown in FIG. 12, the heat sink 420 having a generally cuboid external shape includes the first heat-radiating fin group 22 having a generally cuboid external shape, the second heat-radiating fin group 24 having a generally cuboid external shape adjacent to the first heat-radiating fin group 22, the third heat-radiating fin group 26 having a generally cuboid external shape adjacent to the second heat-radiating fin group 24, and additionally the fourth heat-radiating fin group 28 having a generally cuboid external shape adjacent to the first heat-radiating fin group 22. Moreover, the first heat-radiating fin group 22, second heat-radiating fin group 24, third heat-radiating fin group 26, and fourth heat-radiating fin group 28 are layered on top of one another. The fourth heat-radiating fin group 28 has the same structure as the first heat-radiating fin group 22, second heat-radiating fin group 24, and third heat-radiating fin group 26.

In the cooling device 5, the other end of the first heat pipe group 12 is disposed between the first heat-radiating fin group 22 and second heat-radiating fin group 24; the other end of the second heat pipe group 14 is disposed between the second heat-radiating fin group 24 and third heat-radiating fin group 26; and additionally, the other end of the third heat pipe group 416 is disposed between the first heat-radiating fin group 22 and fourth heat-radiating fin group 28. The heat sink 420 has the first heat-radiating fin group 22 and fourth heat-radiating fin group 28 formed about the other end of the third heat pipe group 416, and the fourth heat-radiating fin group 28 faces the first heat-radiating fin group 22 across the third heat pipe group 416. Furthermore, the other end of the third heat pipe group 416 is arranged with left-right symmetry in a plan view inside the heat sink 420, in a similar manner to the first heat pipe group 12 and second heat pipe group 14.

Moreover, in the cooling device 5, the first heat pipes 11, second heat pipes 13, and third heat pipes 415, which are round containers of a tubular material, are not deformed on the end (i.e., the one end) thermally connected to the heat-generating element.

In the cooling device 5, even if the amount of heat generated among the three heat-generating elements differs, the second heat-radiating fin group 24 and additionally the first heat-radiating fin group 22 can receive heat from the heat pipe group thermally connected to the heat-radiating fin group that has received a relatively large thermal load; thus, in a similar manner to the cooling device 1 of Embodiment 1, it is possible to make the cooling of a plurality (three in FIGS. 11 and 12) of heat-generating elements uniform.

Next, a cooling device according to Embodiment 6 of the present invention will be described with reference to the drawings. Components that are the same as those in the cooling device 1 of Embodiment 1 are assigned the same reference characters.

Figure 14:
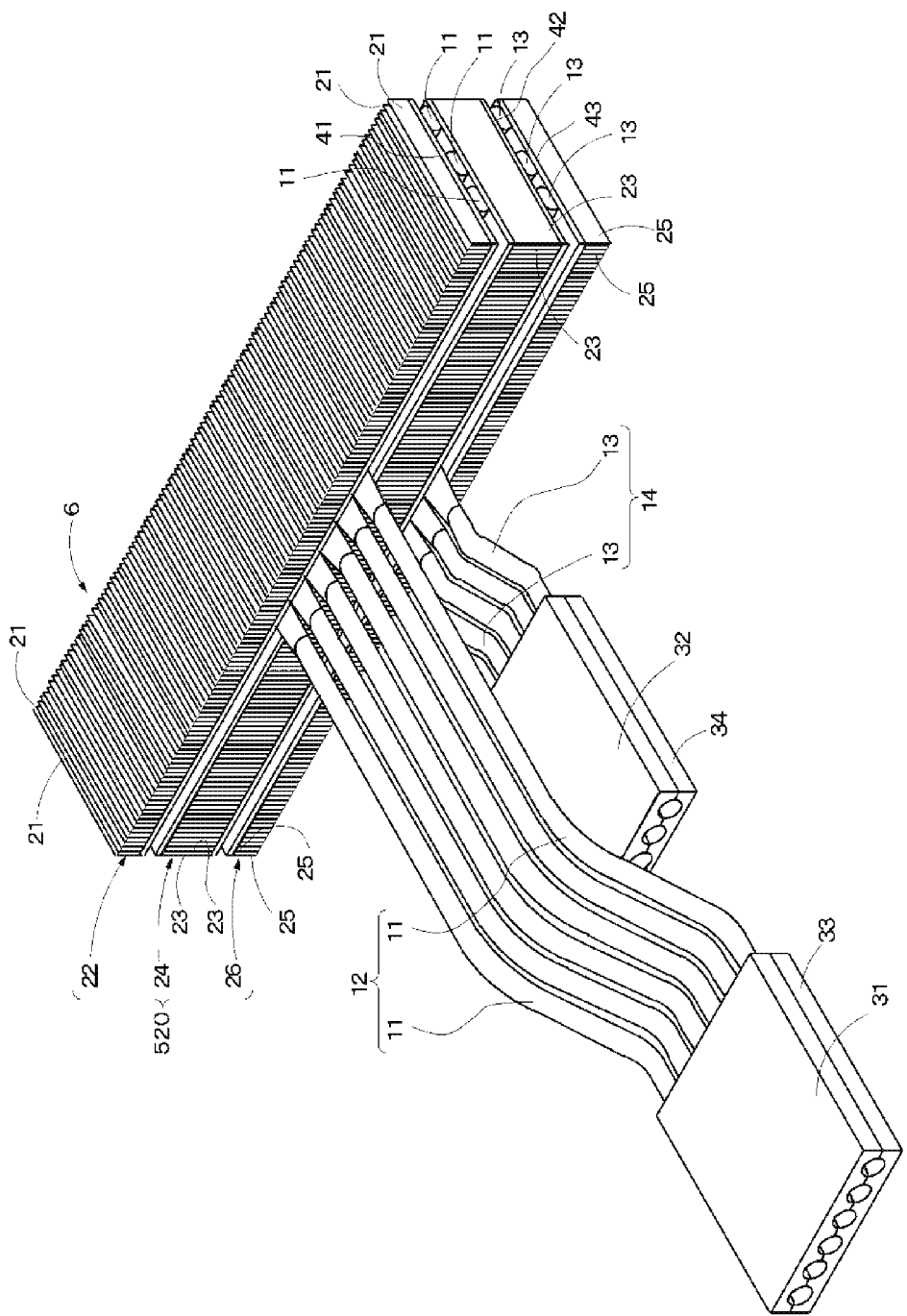
FIG. 14 is a perspective view of a cooling device according to Embodiment 6 of the present invention.
Figure 15:
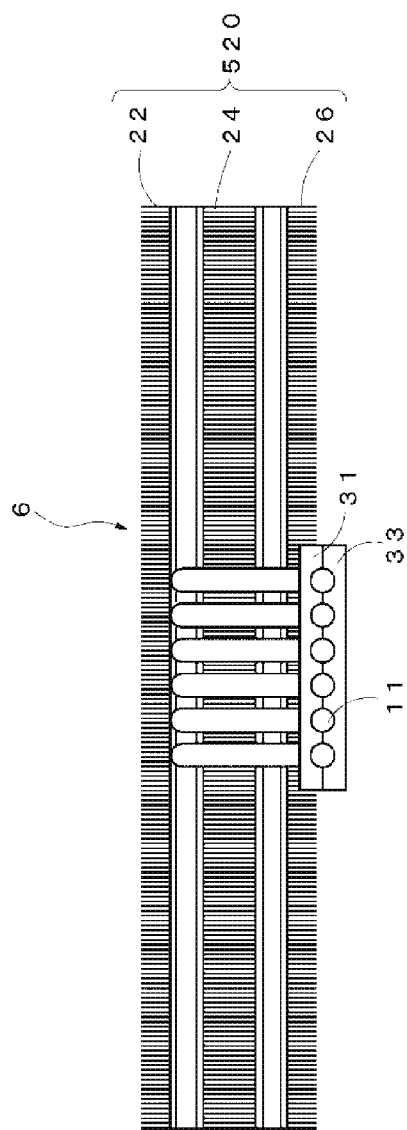
FIG. 15 is a rear view of the cooling device according to Embodiment 6 of the present invention.

As shown in FIGS. 14 and 15, in a cooling device 6 of Embodiment 6, within the heat sink 520 the first heat-radiating fin group 21 is not provided on the sides of the first heat pipe group 12, and the third heat-radiating fins 25 are also not provided on the sides of the second heat pipe group 14. In other words, the top of the second heat-radiating fins 23 does not contact the first support member 41, and the first heat-radiating fins 21 are not thermally connected to the second heat-radiating fins 23 via the first support member 41. Furthermore, the top of the third heat-radiating fins 25 does not contact the second support member 42, and the second heat-radiating fins 23 are not thermally connected to the third heat-radiating fins 25 via the second support member 42. Accordingly, in the cooling device 6, the third support member 43 to which the third heat-radiating fins 25 are attached is not shared by the second support member 42.

In the cooling device 6, the first heat pipe group 12 is constituted by six first heat pipes 11, and the second heat pipe group 14 is constituted by six second heat pipes 13. In addition, the shape of the heat sink 520 of the cooling device 6 is a generally cuboid shape with a length in the lengthwise direction that is longer relative to the length in the widthwise direction, as compared to the cooling device 1 of Embodiment 1. Moreover, as shown in FIG. 15, in the cooling device 6, the first heat pipes 11 and second heat pipes 13, which are round containers of a tubular material, are not deformed on the end (i.e., the one end) side thermally connected to the heat-generating element. Furthermore, in the cooling device 6, a heat-receiving plate 33 is disposed between the first heat pipe group 12 and first heat-generating element (not shown), and a heat-receiving plate 34 is disposed between the second heat pipe group 14 and the second heat-generating element (not shown). In the cooling device 6, the heat-receiving plate 33 has trenches formed therein for accommodating the heat-generating element side of the first heat pipe group 12, and the heat-receiving plate 34 has trenches formed therein for accommodating the heat-generating element side of the second heat pipe group 14.

As in above configurations, in the cooling device 6, the first heat pipes 11 thermally connected to the first heat-generating element and the second heat pipes 13 thermally connected to the second heat-generating element are all thermally connected to the second heat-radiating fin group 24; therefore, even if the amount of heat generated by the first heat-generating element differs from the amount of heat generated by the second heat-generating element, the second heat-radiating fin group 24 can make the cooling of the first heat-generating element and second heat-generating element uniform.

Next, a usage example of the cooling device of the present invention will be described. The use application of the cooling device of the present invention has no particular limitations, and can be a cooling device for an apparatus equipped with an electronic component having a heat-generating element such as a computer or server, or as a cooling device for a battery or the like, for example. The cooling device of the respective embodiments described above has bends in the first heat pipes 11 and second heat pipes 13 & 113 at the section of these heat pipes thermally connected to the heat sink 20, and these bends reduce the dimensions in the long-axis direction of the first heat pipe group 12 and second heat pipe groups 14 & 114 while ensuring the dimensions of the heat sink 20 in the lengthwise direction; thus, the cooling device of the respective embodiments described above is suitable for the cooling of a plurality of heat-generating elements in a server, for example.

Next, another embodiment of the cooling device of the present invention will be described. In the respective embodiments above, the number of heat pipes constituting the first heat pipe group and second heat pipe group was four or eight, but the number of heat pipes can be selected as appropriate depending on the amount of heat generated by the heat-generating element, and the number may be a single heat pipe, two to three heat pipes, five heat pipes, or seven or more heat pipes. Furthermore, the number of heat pipes constituting the first heat pipe group and the number of heat pipes constituting the second heat pipe group may be the same or different from each other.

In addition, in the respective embodiments described above, the first heat pipe group was introduced into the heat sink from the direction orthogonal to the lengthwise direction of the heat sink, but the first heat pipe group may be introduced into the heat sink in a direction that is angled, but not right-angled, with respect to a direction in which a plurality of heat-radiating fins are arranged, and thus may be introduced into the heat sink from a direction at an obtuse angle to the lengthwise direction of the heat sink. Similarly, in the respective embodiments described above, the second heat pipe group was introduced into the heat sink from the direction orthogonal to the lengthwise direction of the heat sink, but the second heat pipe group may be introduced into the heat sink in a direction that is angled, but not right-angled, with respect to a direction in which a plurality of heat-radiating fins are arranged, and thus may be introduced into the heat sink from a direction at an obtuse angle to the lengthwise direction of the heat sink.

Furthermore, in the respective embodiments described above, there were two or three heat pipe groups based on there being two or three heat-generating elements, and the heat sink was a three- or four-layer structure having three or four heat-radiating fin groups, but the number of heat pipes group has no particular limitations; there may be four or more heat pipe groups, and based on this, the heat sink may be a structure with five or more layers having five or more heat-radiating fin groups, for example.

Moreover, in the respective embodiments described above, the first heat pipes constituting the first heat pipe group were all the same diameter, but the first heat pipes may have differing diameters as necessary and appropriate. Similarly, the second heat pipes constituting the second heat pipe group were all the same diameter, but the second heat pipes may have differing diameters as necessary and appropriate. Furthermore, in the respective embodiments described above, the diameter of the first heat pipes was the same as the diameter of the second heat pipes, but these diameters may differ based on the amount of heat generated by the first heat-generating element and second heat-generating element as appropriate.

In addition, in the respective embodiments described above, when the other ends of the heat pipe groups are introduced into the heat sink 20 from the center of the heat sink in the lengthwise direction, the heat pipes were arranged with left-right symmetry in a plan view inside the heat sink, but the heat pipes do not necessarily need to be arranged with left-right symmetry, depending on the heat-generating state of the heat-generating element. In the respective embodiments described above, the heat-radiating fins were attached to the support member, but the heat-radiating fins may be directly attached via a method such as soldering to the first heat pipes or second heat pipes without using the support member.

In the respective embodiments described above, the third heat-radiating fin group, which was thermally connected to the second heat pipe group, was provided, but the third heat-radiating fin group does not necessarily need to be provided, depending on usage conditions, such as if the thermal load of the second heat pipe group is very light. In the respective embodiments described above, the first heat-radiating fin group, which was thermally connected to the first heat pipe group, was provided, but the first heat-radiating fin group does not necessarily need to be provided, depending on usage conditions, such as if the thermal load of the first heat pipe group is very light.

Working Examples

Next, working examples of the present invention will be explained, but the present invention is not limited to these examples to the extent that there is no departure from the spirit of the present invention.

Figure 16:
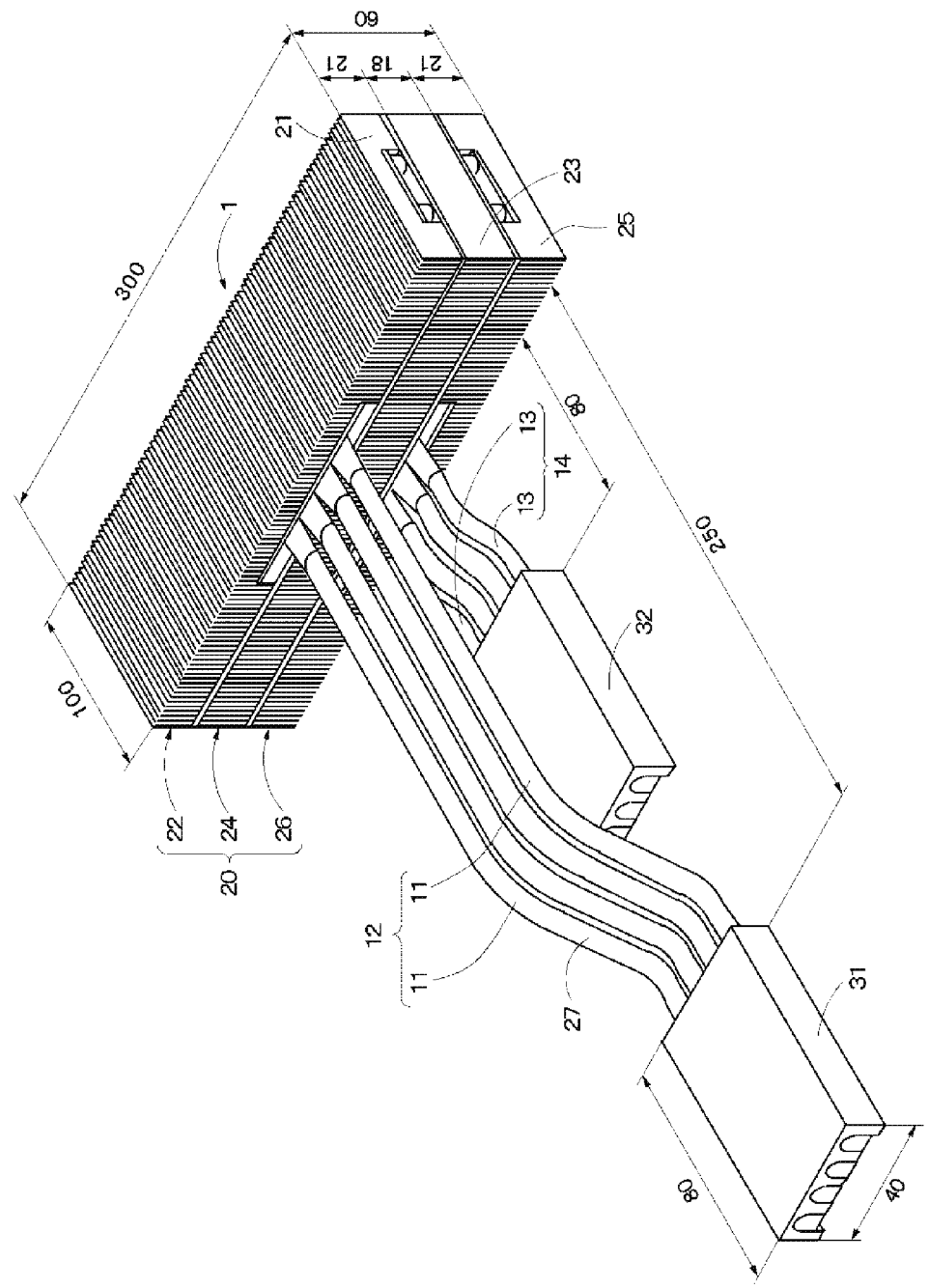
FIG. 16 illustrates a cooling device used in a working example.

The cooling device 1 of Embodiment 1 was used as the cooling device of the working example. The dimensions of the parts of the cooling device 1 of Embodiment 1 used in the working example are shown in FIG. 16. The unit of the dimensions is millimeters. In the cooling device 1 of the working example, the four first heat pipes 11, which are round containers of a tubular material, and the four second heat pipes 13, which are also round containers of a tubular material, are both 8 mm in diameter and have a flattened section that is 4 mm thick. The first heat-radiating fins 21, second heat-radiating fins 23, and third heat-radiating fins 25 are all made of aluminum with a thickness of 0.15 mm and are arrayed at a fin pitch of 1.5 mm.

Figure 17:
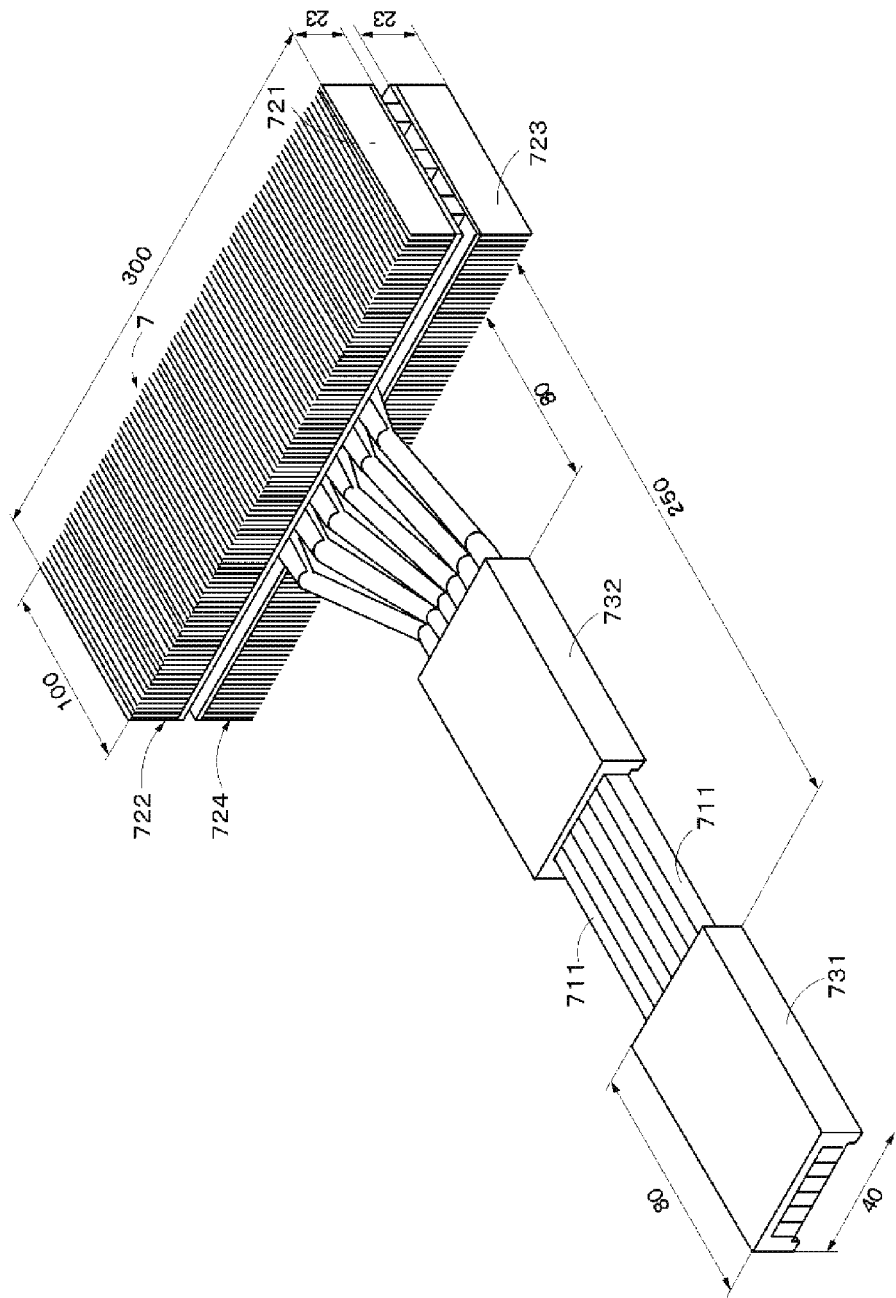
FIG. 17 illustrates a conventional cooling device used in a comparative example.

A conventional cooling device 7 shown in FIG. 7 was used as a comparative example. The unit of the dimensions in FIG. 17 is millimeters. As shown in FIG. 17, the dimensions of a first cover 731, the dimensions of a second cover 732, the dimensions in the lengthwise direction of flat-type heat pipes 711, and the vertical and horizontal dimensions of a first heat-radiating fin group 722 and second heat-radiating fin group 724 of the conventional cooling device 7 are the same as the cooling device 1.

In the conventional cooling device 7, a heat-radiating fin group corresponding to the third heat-radiating fin group of the working example is not provided, but rather six flat-type heat pipes 711 are arranged between the first heat-radiating fin group 722 and second heat-radiating fin group 724. Each of the flat-type heat pipes 711 is a flattened round tubular material that is 8 mm in diameter with a thickness of 4 mm. Furthermore, the flat-type heat pipes 711 are arranged in parallel such that the flat sections face and are adjacent to one another. Of the six flat-type heat pipes 711, the three flat-type heat pipes 711 on the right side bend in the right direction, whereas the three flat-type heat pipes 711 on the left side bend in the left direction.

Moreover, the first heat-radiating fins 721 and second heat-radiating fins 723 are all made of aluminum with a thickness of 0.15 mm and are arrayed at a fin pitch of 1.5 mm, in a similar manner to the cooling device 1 of the working example. In the conventional cooling device 7, the reason that the number of flat-type heat pipes 711 is restricted to six is due to the width direction dimensions of the first cover 731 and second cover 732, which are heat-receiving members, being restricted to 40 mm, which is the same as in the cooling device 1; i.e., the cooling device 1 of the working example and the cooling device 7 of the comparative conventional example have the same amount of area thermally connecting to the heat-generating element (not shown). Due to the above, the comparative conventional cooling device 7 was more restricted in the number of heat pipes than the cooling device 1 of the working example, and it was necessary to flatten the shape of the heat pipes or the like to even slightly increase the number of heat pipes.

The thermal resistance values of the working example and comparative example were measured with input heat quantity from each heat-generating element at 80W and air volume of the cooling air supplied to the heat-radiating fins at 35 cfm. The measurement results are shown in FIG. 18.

As shown in FIG. 18, in the working example, it was possible to reduce the thermal resistance of the heat-receiving area of the cooling device 1 (i.e., from the heat-generating element [not shown] connected to the first cover 31 to the middle section of the first heat pipes 11 in the lengthwise direction) to 0.066° C./W and to reduce the thermal resistance of the heat-radiating area of the cooling device (from the middle of the first heat pipes 11 in the lengthwise direction to the air between the first heat-radiating fin group 22, second heat-radiating fin group 24, and third heat-radiating fin group 26) to 0.052° C./W. Furthermore, in the working example, it was possible to reduce the total thermal resistance of the cooling device 1 (i.e., from the first heat-generating element to the air between the first heat-radiating fin group 22, second heat-radiating fin group 24, and third heat-radiating fin group 26) to 0.118° C./W.

In contrast, in the comparative example, the thermal resistance of the heat-receiving area of the conventional cooling device 7 (i.e., from the heat-generating element [not shown] connected to the first cover 731 to the middle section of the flat-type heat pipes 711 in the lengthwise direction) was 0.073° C./W and the thermal resistance of the heat-radiating area of the cooling device (from the middle of the flat-type heat pipes 711 in the lengthwise direction to the air between the first heat-radiating fin group 722 and second heat-radiating fin group 724) was 0.075° C./W, which were markedly steep increases compared to the working example. Furthermore, in the comparative example, the total thermal resistance of the conventional cooling device 7 (i.e., from the first heat-generating element to the air between the first heat-radiating fin group 722 and second heat-radiating fin group 724) was 0.148° C./W, which was a markedly steep increase compared to the working example. In this manner, in the working example, the thermal resistance value of the heat-receiving area was reduced by approx. 10% and the heat-radiating area by approx. 30%, for a total reduction in the thermal resistance value of approx. 20% as compared to the comparative example.

In the working example, unlike in the comparative example, it is not necessary to have specialized heat pipes thermally connected to the heat-generating elements or to flatten the heat pipes and arrange the pipes such that the flat sections face and are adjacent to one another; thus, thermal connectivity with the heat-generating elements was improved, and this is thought to have made it possible to reduce the thermal resistance values. Moreover, in the working example, the first heat pipes 11 and second heat pipes 13 overlap each other in a plan view and bottom view, and thus it is possible to increase the number of heat pipes and greatly increase the contact area between the heat pipes and the heat-radiating fins; this is thought to have made it possible to reduce the thermal resistance values. In addition, in the working example, because the first heat pipes 11 and second heat pipes 13 overlap each other in a plan view and bottom view, it was possible to reduce the dimensions of the heat-radiating fins in the height direction, and the heat-dissipating efficiency of the heat-radiating fins was improved as a result; this is thought to have made it possible to reduce the thermal resistance values.

The cooling device of the present invention is applicable to a wide variety of fields, but because it is possible to ensure the dimensions of the heat sink in the lengthwise direction while reducing the dimensions of the heat pipes in the long-axis direction, the cooling device of the present invention is particularly valuable in the cooling field for heat-generating elements such as calculation elements provided in a server, for example.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A cooling device, comprising:
a first heat-radiating fin group having a plurality of first heat-radiating fins that are arranged parallel to each other in a first direction;
a second heat-radiating fin group having a plurality of second heat-radiating fins that are arranged parallel to each other in said first direction, the first heat-radiating fin group superimposing the second heat-radiating fin group;
a third heat-radiating fin group having a plurality of third heat-radiating fins that are arranged parallel to each other in said first direction, the second heat-radiating fin group superimposing the third heat-radiating fin group;
one or more of first heat pipes, one end of each first heat pipe being configured to be thermally connected to a first heat-generating element, another end of each first heat pipe being thermally connected to the first and second heat-radiating fin groups; and one or more of second heat pipes, one end of each second heat pipe being configured to be thermally connected to a second heat-generating element, another end of each second heat pipe being thermally connected to the second and third heat-radiating fin groups, wherein said another end of each of the first heat pipes is inserted between the first heat-radiating fin group and the second heat-radiating fin group and has a bending part in the inserted another end so that respective inserted another ends of said one or more of first heat pipes altogether span a planar area between the first heat-radiating fin group and the second heat-radiating fin group, and are thermally connected to the first and second heat-radiating fin groups, wherein said another end of each of the second heat pipes is inserted between the second heat-radiating fin group and the third heat-radiating fin group and has a bending part in the inserted another end so that respective inserted another ends of said one or more of second heat pipes altogether span a planar area between the second heat-radiating fin group and the third heat-radiating fin group, and are thermally connected to the second and third heat-radiating fin groups, wherein said another ends of the one or more of first heat pipes are positioned above said another ends of the one or more of the second heat pipes, wherein said one or more of first heat pipes are provided in a plurality, and said one or more of second heat pipes are provided in a plurality, and wherein at least one of the plurality of first heat pipes and at least one of the plurality of the second heat pipes are in parallel to one another.

2. A cooling device, comprising:

a first heat-radiating fin group having a plurality of first heat-radiating fins that are arranged parallel to each other in a first direction;

a second heat-radiating fin group having a plurality of second heat-radiating fins that are arranged parallel to each other in said first direction, the first heat-radiating fin group superimposing the second heat-radiating fin group;

one or more of first heat pipes, one end of each first heat pipe being configured to be thermally connected to a first heat-generating element, another end of each first heat pipe being thermally connected to the first and second heat-radiating fin groups; and one or more of second heat pipes, one end of each second heat pipe being configured to be thermally connected to a second heat-generating element, another end of each second heat pipe being thermally connected to the second heat-radiating fin group, wherein said another end of each of the first heat pipes is inserted between the first heat-radiating fin group and the second heat-radiating fin group and has a bending part in the inserted another end so that respective inserted another ends of said one or more of first heat pipes altogether span a planar area between the first heat-radiating fin group and the second heat-radiating fin group, and are thermally connected to the first and second heat-radiating fin groups, wherein said another end of each of the second heat pipes is inserted into a bottom portion of the second heat-radiating fin group and has a bending part in the inserted another end so that respective inserted another ends of said one or more of second heat pipes altogether span a planar area of the bottom portion of the second heat-radiating fin group, and are thermally connected to the second heat-radiating fin groups, wherein said another ends of the one or more of first heat pipes are positioned above said another ends of the one or more of the second heat pipes, wherein said one or more of first heat pipes are provided in a plurality, and said one or more of second heat pipes are provided in a plurality, and wherein at least one of the plurality of first heat pipes and at least one of the plurality of the second heat pipes are in parallel to one another.

3. A cooling device, comprising:

a first heat-radiating fin group having a plurality of first heat-radiating fins that are arranged parallel to each other in a first direction;

a second heat-radiating fin group having a plurality of second heat-radiating fins that are arranged parallel to each other in said first direction, the first heat-radiating fin group superimposing the second heat-radiating fin group;

one or more of first heat pipes, one end of each first heat pipe being configured to be thermally connected to a first heat-generating element, another end of each first heat pipe being thermally connected to the first heat-radiating fin group; and one or more of second heat pipes, one end of each second heat pipe being configured to be thermally connected to a second heat-generating element, another end of each second heat pipe being thermally connected to the first and second heat-radiating fin groups, wherein said another end of each of the first heat pipes is inserted into a top portion of the first heat-radiating fin group and has a bending part in the inserted another end so that respective inserted another ends of said one or more of first heat pipes altogether span a planar area of the top portion of the first heat-radiating fin group, and are thermally connected to the first heat-radiating fin group, wherein said another end of each of the second heat pipes is inserted between the first heat-radiating fin group and the second heat-radiating fin group and has a bending part in the inserted another end so that respective inserted another ends of said one or more of second heat pipes altogether span a planar area between the first heat-radiating fin group and the second heat-radiating fin group, and are thermally connected to the first and second heat-radiating fin groups, wherein said another ends of the one or more of first heat pipes are positioned above said another ends of the one or more of the second heat pipes, wherein said one or more of first heat pipes are provided in a plurality, and said one or more of second heat pipes are provided in a plurality, and wherein at least one of the plurality of first heat pipes and at least one of the plurality of the second heat pipes are in parallel to one another.

4. The cooling device according to claim 1, wherein said one ends of the one or more of second heat pipes are positioned closer to said superimposed first, second and third heat-radiating fin groups than said one ends of the one or more of the first heat pipes.

5. The cooling device according to claim 2, wherein said one ends of the one or more of second heat pipes are positioned closer to said superimposed first and second heat-radiating fin groups than said one ends of the one or more of the first heat pipes.

6. The cooling device according to claim 3, wherein said one ends of the one or more of second heat pipes are positioned closer to said superimposed first and second heat-radiating fin groups than said one ends of the one or more of the first heat pipes.

7. The cooling device according to claim 1, wherein a direction of said insertion of said another ends of said one or more of first heat pipes and said another ends of said one or more of second heat pipes is angled with respect to the first direction in a plan view.

8. The cooling device according to claim 1, wherein a direction of said insertion of said another ends of said one or more of first heat pipes and said another ends of said one or more of second heat pipes is right-angled with respect to the first direction in a plan view.

9. The cooling device according to claim 1,
wherein the plurality of first heat pipes and the plurality of the second heat pipes are respectively in parallel to one another.

10. The cooling device according to claim 2,
wherein the plurality of first heat pipes and the plurality of the second heat pipes are respectively in parallel to one another.

11. The cooling device according to claim 3,
wherein the plurality of first heat pipes and the plurality of the second heat pipes are respectively in parallel to one another.

12. The cooling device according to claim 9, wherein at least one of the first heat pipes overlaps at least a portion of at least one of the second heat pipes in a plan view.

13. The cooling device according to claim 9, wherein none of the first heat pipes overlaps any of the second heat pipes in a plan view.

14. The cooling device according to claim 9, wherein said inserted another ends of the first heat pipes are arranged in a left-right symmetric manner in said planar area with said first direction being the left-right direction.

15. The cooling device according to claim 9, wherein said inserted another ends of the second heat pipes are arranged in a left-right symmetric manner in said planar area with said first direction being the left-right direction.

16. The cooling device according to claim 1, wherein at least some of said first heat-radiating fins of the first heat-radiating fin group have a cutout at a bottom part thereof to accommodate said another ends of said one or more of first heat pipes.

17. The cooling device according to claim 1, wherein at least some of said third heat-radiating fins of the third heat-radiating fin group have a cutout at a top part thereof to accommodate said another ends of said one or more of second heat pipes.

18. The cooling device according to claim 1, wherein at least some of said second heat-radiating fins of the second heat-radiating fin group have a cutout at a bottom part thereof to accommodate said another ends of said one or more of second heat pipes.

19. The cooling device according to claim 1, further comprising either or both of a first heat-receiving plate and a second heat-receiving plate, said first heat-receiving plate being attached to each of said one ends of said one or more of first heat pipes so as to convey heat from the first heat-generating element to said one ends of said one or more of first heat pipes, and said second heat-receiving plate being attached to each of said one ends of said one or more of second heat pipes to convey heat from the second heat-generating element to said one ends of said one or more of second heat pipes.

20. The cooling device according to claim 1, wherein said another ends of said one or more of first heat pipes are flattened in said planar area into which said another ends are inserted, and said another ends of said one or more of second heat pipes are flattened in said planar area into which said another ends are inserted.

\* \* \* \* \*